(12) United States Patent
Okumura et al.

(10) Patent No.: US 10,580,916 B2
(45) Date of Patent: Mar. 3, 2020

(54) INFRARED DETECTOR, IMAGING DEVICE, IMAGING SYSTEM, AND METHOD OF MANUFACTURING INFRARED DETECTOR

(71) Applicant: FUJITSU LIMITED, Kawasaki-shi, Kanagawa (JP)

(72) Inventors: Shigekazu Okumura, Setagaya (JP); Ryo Suzuki, Fujisawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/238,573

(22) Filed: Jan. 3, 2019

(65) Prior Publication Data
US 2019/0221693 A1    Jul. 18, 2019

(30) Foreign Application Priority Data
Jan. 15, 2018   (JP) .................................. 2018-004156

(51) Int. Cl.
*H01L 31/0352*    (2006.01)
*H01L 27/146*    (2006.01)

(52) U.S. Cl.
CPC .............. *H01L 31/035209* (2013.01); *H01L 27/14627* (2013.01); *H01L 27/14649* (2013.01); *H01L 27/14652* (2013.01); *H01L 27/14683* (2013.01); *H01L 27/14694* (2013.01)

(58) Field of Classification Search
CPC ....... H01L 31/035209; H01L 27/14627; H01L 27/14649; H01L 27/14652; H01L 27/14683; H01L 27/14694
See application file for complete search history.

(56) References Cited

U.S. PATENT DOCUMENTS

| 6,198,101 B1 * | 3/2001 | Brown | .................. B82Y 20/00 250/338.4 |
| 6,996,150 B1 * | 2/2006 | Shakuda | ............... H01L 33/007 257/E33.005 |

(Continued)

FOREIGN PATENT DOCUMENTS

| JP | 2006-012974 | 1/2006 |
| JP | 2006012974 A * | 1/2006 |

(Continued)

OTHER PUBLICATIONS

B. F. Levine, "Quantum-well infrared photodetectors", Journal of Applied Physics 74, R1 (1993) (82 pages).

*Primary Examiner* — Earl N Taylor
(74) *Attorney, Agent, or Firm* — Fujitsu Patent Center

(57) ABSTRACT

An infrared detector includes, a substrate, a lower contact layer formed on the substrate, a first light receiving layer that is formed on the lower contact layer and has a quantum well structure, an intermediate contact layer formed on the first light receiving layer, a second light receiving layer that is formed on the intermediate contact layer and has a quantum well structure, and an upper contact layer formed on the second light receiving layer. Each of the first light receiving layer and the second light receiving layer includes, a first semiconductor layer that is doped with a first conductivity-type impurity, and a second semiconductor layer that is formed on the first semiconductor layer, and is doped with a second conductivity-type impurity which compensates the first conductivity-type impurity.

18 Claims, 31 Drawing Sheets

(56) References Cited

U.S. PATENT DOCUMENTS

| | | | | |
|---|---|---|---|---|
| 9,018,727 B2* | 4/2015 | Ni | .................. | H01L 31/1035 |
| | | | | 257/448 |
| 9,472,707 B2* | 10/2016 | Shirane | ............. | H01L 31/03521 |
| 10,483,430 B1* | 11/2019 | Lutgen | .................. | H01L 33/20 |
| 2009/0072144 A1* | 3/2009 | Krishna | .................. | G01J 3/02 |
| | | | | 250/338.4 |
| 2010/0147674 A1* | 6/2010 | Krivoshlykov | ........ | G02B 6/122 |
| | | | | 204/157.4 |
| 2011/0140082 A1* | 6/2011 | Iguchi | .................. | B82Y 20/00 |
| | | | | 257/14 |
| 2011/0277829 A1* | 11/2011 | Fafard | .................. | B82Y 10/00 |
| | | | | 136/255 |
| 2013/0145330 A1* | 6/2013 | Choi | .................. | G06F 17/5045 |
| | | | | 716/107 |
| 2015/0364547 A1* | 12/2015 | Vizbaras | ........... | H01L 21/02546 |
| | | | | 257/22 |
| 2016/0064899 A1* | 3/2016 | Hayakawa | .......... | H01S 5/18311 |
| | | | | 398/200 |
| 2016/0111567 A1* | 4/2016 | Shi | ...................... | H01L 31/0324 |
| | | | | 257/441 |
| 2016/0365463 A1* | 12/2016 | Lee | .................. | H01L 31/02161 |
| 2017/0054922 A1* | 2/2017 | Novotny | ........... | H01L 21/76224 |
| 2018/0172508 A1* | 6/2018 | Kotani | ...................... | G01J 5/20 |
| 2018/0188356 A1* | 7/2018 | Na | ........................ | G01S 7/4863 |
| 2018/0190698 A1* | 7/2018 | Na | .................. | H01L 27/14612 |
| 2018/0190702 A1* | 7/2018 | Na | .................. | H01L 27/14629 |
| 2018/0212080 A1* | 7/2018 | Meyer | .................. | G01N 21/00 |
| 2018/0248058 A1* | 8/2018 | Yakes | .................. | H01L 31/101 |
| 2018/0315872 A1* | 11/2018 | Balasekaran | ..... | H01L 31/03046 |
| 2019/0035954 A1* | 1/2019 | Fuyuki | ............. | H01L 31/03046 |
| 2019/0044010 A1* | 2/2019 | Arikata | ................. | H01L 31/101 |
| 2019/0067899 A1* | 2/2019 | Tsuji | .................. | H01S 5/18311 |
| 2019/0221693 A1* | 7/2019 | Okumura | .......... | H01L 31/03520 |

FOREIGN PATENT DOCUMENTS

| | | |
|---|---|---|
| JP | 2013-058580 | 3/2013 |
| JP | 2013058580 A * | 3/2013 |

* cited by examiner

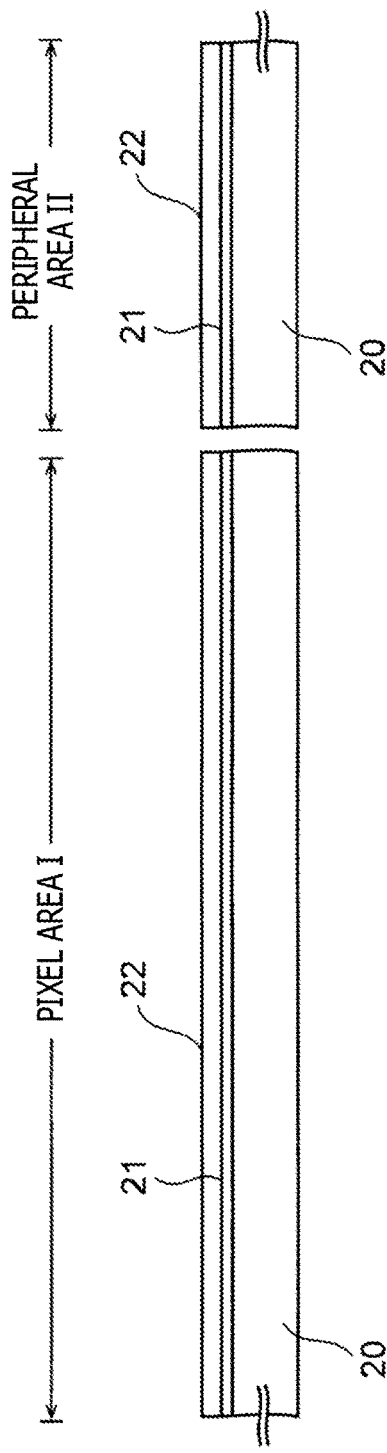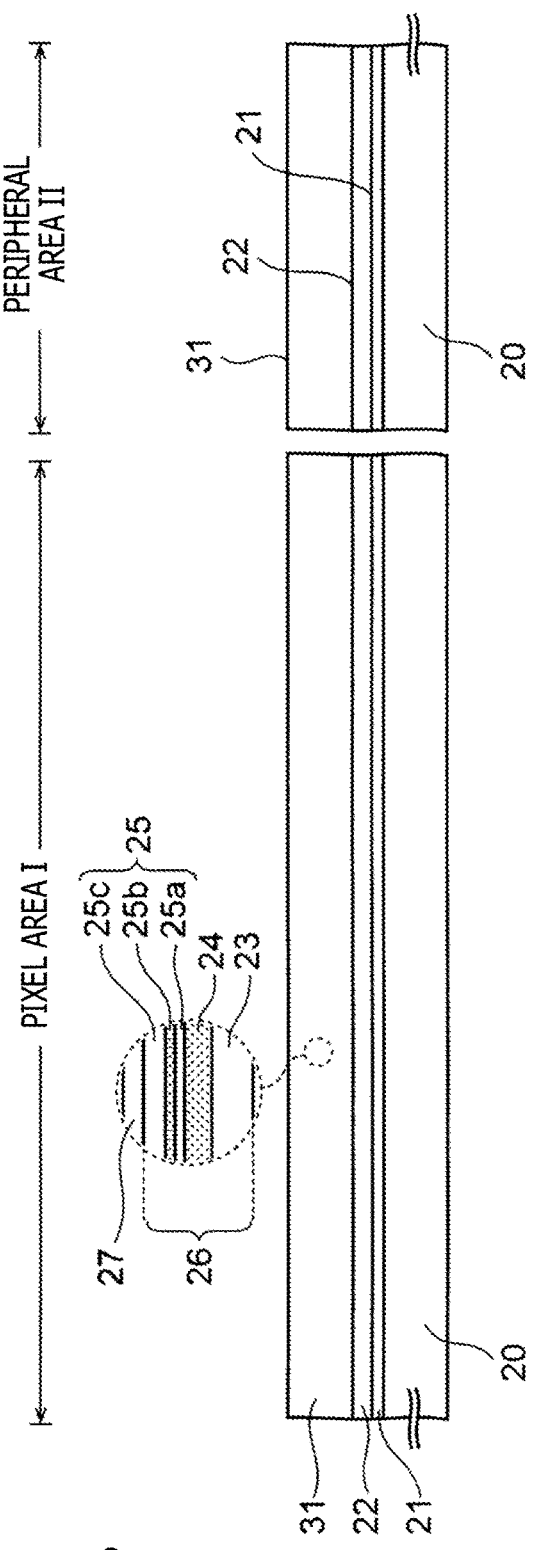

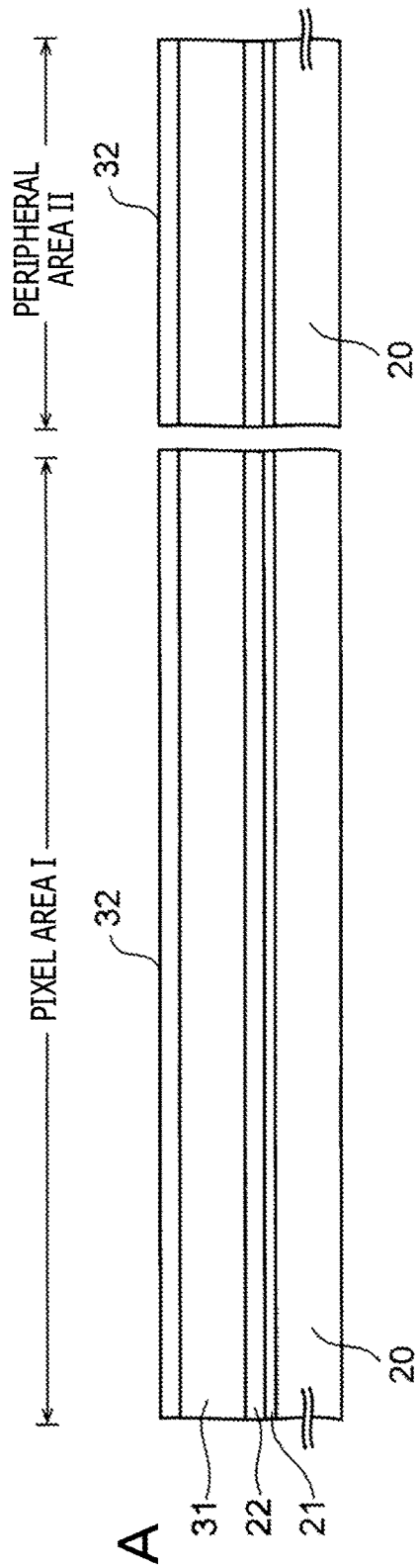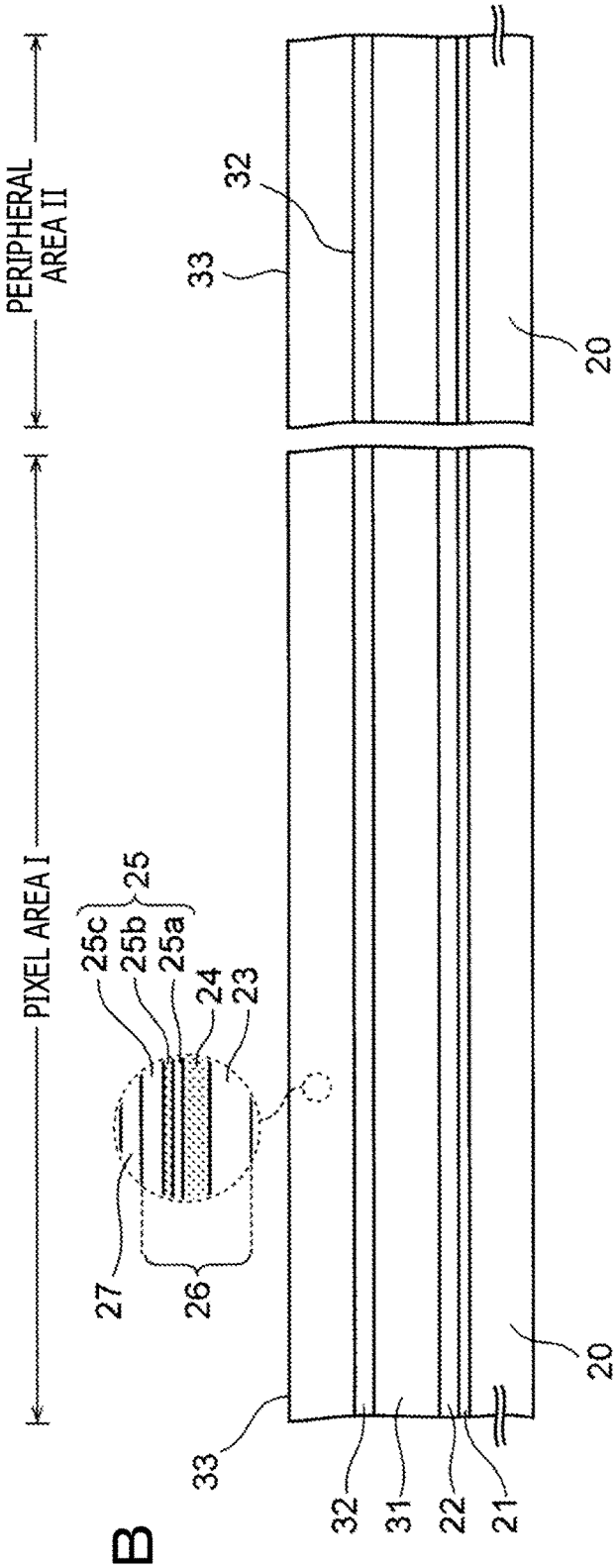

FIG. 22

| | | | GaAs/AlGaAs BASED | | | InP/InGaAs BASED | | |
|---|---|---|---|---|---|---|---|---|
| | | | | IMPURITY | | | IMPURITY | |
| | | | MATERIAL | CARRIER = ELECTRON | CARRIER = POSITIVE HOLE | MATERIAL | CARRIER = ELECTRON | CARRIER = POSITIVE HOLE |
| SUBSTRATE 20 | | | GaAs | NONE | NONE | InP | NONE | NONE |
| BUFFER LAYER 21 | | | GaAs | NONE | NONE | InP | NONE | NONE |
| LOWER CONTACT LAYER 22 | | | GaAs | Si | Zn,Be, OR C | InP | Si | Zn,Be, OR C |
| FIRST LIGHT RECEIVING LAYER 31, SECOND LIGHT RECEIVING LAYER 33 | | FIRST BARRIER LAYER 23 | $Al_{0.25}Ga_{0.75}As$ | NONE | NONE | InP | NONE | NONE |
| | | SECOND BARRIER LAYER 24 | $Al_{0.25}Ga_{0.75}As$ | Si | Zn,Be, OR C | InP | Si | Zn,Be, OR C |
| | THIRD BARRIER LAYER 25 | LOWER LAYER 25a | $Al_{0.25}Ga_{0.75}As$ | NONE | NONE | InP | NONE | NONE |
| | | INTERMEDIATE LAYER 25b | $Al_{0.25}Ga_{0.75}As$ | Zn,Be, OR C | Si | InP | Zn,Be, OR C | Si |
| | | UPPER LAYER 25c | $Al_{0.25}Ga_{0.75}As$ | NONE | NONE | InP | NONE | NONE |
| | BARRIER LAYER 26 | | GaAs | NONE | NONE | $In_{0.53}Ga_{0.47}As$ | NONE | NONE |
| QUANTUM WELL LAYER 32 | | | GaAs | Si | Zn,Be, OR C | InP | Si | Zn,Be, OR C |
| INTERMEDIATE CONTACT LAYER 34 | | | | | | | | |
| UPPER CONTACT LAYER 34 | | | GaAs | Si | Zn,Be, OR C | InP | Si | Zn,Be, OR C |

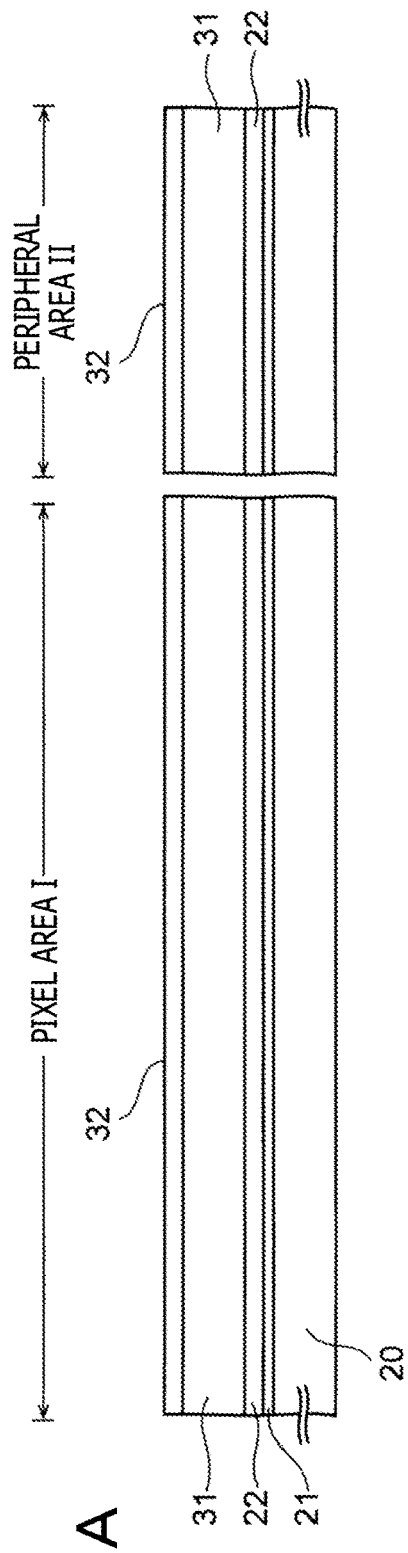
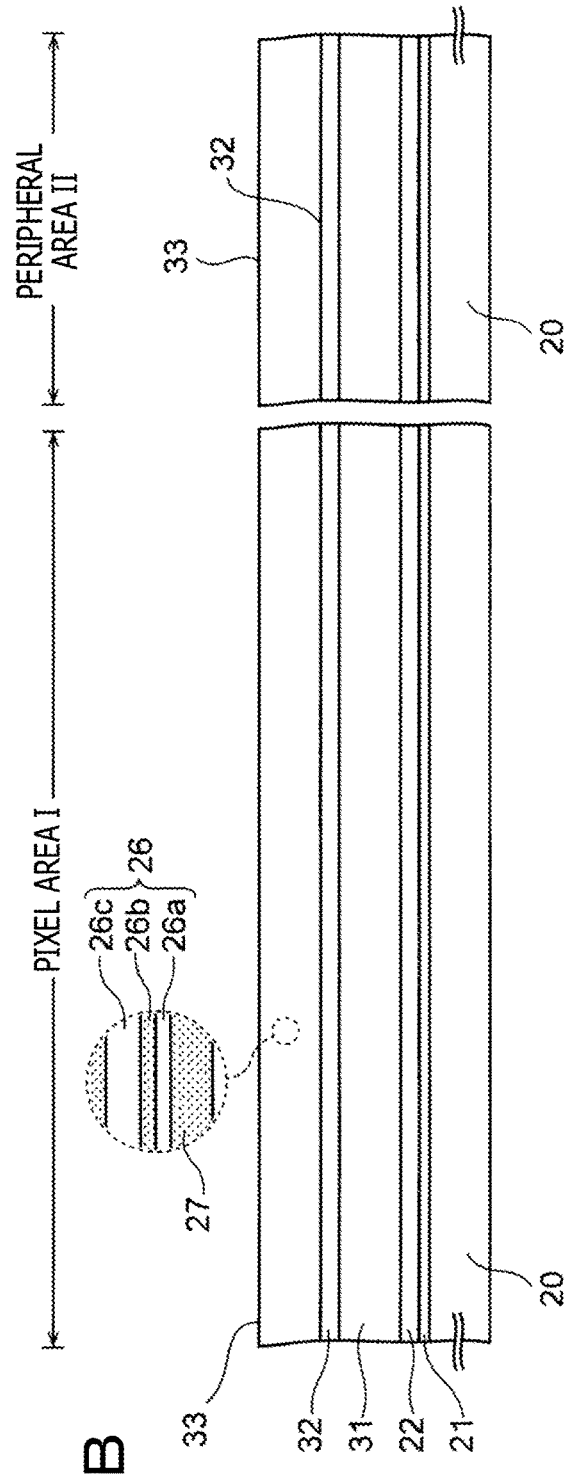

FIG. 29

| | | | GaAs/AlGaAs BASED | | | InP/InGaAs BASED | | |
|---|---|---|---|---|---|---|---|---|
| | | | | IMPURITY | | | IMPURITY | |
| | | | MATERIAL | CARRIER = ELECTRON | CARRIER = POSITIVE HOLE | MATERIAL | CARRIER = ELECTRON | CARRIER = POSITIVE HOLE |
| SUBSTRATE 20 | | | GaAs | NONE | NONE | InP | NONE | NONE |
| BUFFER LAYER 21 | | | GaAs | NONE | NONE | InP | NONE | NONE |
| LOWER CONTACT LAYER 22 | | | GaAs | Si | Zn, Be, OR C | InP | Si | Zn, Be, OR C |
| FIRST LIGHT RECEIVING LAYER 31, SECOND LIGHT RECEIVING LAYER 33 | THIRD BARRIER LAYER 25 | LOWER LAYER 25a | $Al_{0.25}Ga_{0.75}As$ | NONE | NONE | InP | NONE | NONE |
| | | INTERMEDIATE LAYER 25b | $Al_{0.25}Ga_{0.75}As$ | Zn, Be, OR C | Si | InP | Zn, Be, OR C | Si |
| | | UPPER LAYER 25c | $Al_{0.25}Ga_{0.75}As$ | NONE | NONE | InP | NONE | NONE |
| | BARRIER LAYER 26 | | GaAs | Si | Zn, Be, OR C | $In_{0.53}Ga_{0.47}As$ | Si | Zn, Be, OR C |
| | QUANTUM WELL LAYER 32 | | GaAs | Si | Zn, Be, OR C | InP | Si | Zn, Be, OR C |
| INTERMEDIATE CONTACT LAYER 34 | | | GaAs | Si | Zn, Be, OR C | InP | Si | Zn, Be, OR C |
| UPPER CONTACT LAYER 34 | | | | | | | | |

INFRARED DETECTOR, IMAGING DEVICE, IMAGING SYSTEM, AND METHOD OF MANUFACTURING INFRARED DETECTOR

CROSS-REFERENCE TO RELATED APPLICATION

This application is based upon and claims the benefit of priority of the prior Japanese Patent Application No. 2018-4156, filed on Jan. 15, 2018, the entire contents of which are incorporated herein by reference.

FIELD

The embodiments discussed herein are related to an infrared detector, an imaging device, an imaging system, and a method of manufacturing an infrared detector.

BACKGROUND

Infrared detectors which detect infrared light invisible to human eyes have been widely distributed for applications for crime prevention and defense. In an infrared detector, infrared light to be detected is absorbed in a light receiving layer of a semiconductor, and current is obtained by collecting the carriers generated in the light receiving layer.

Materials for a semiconductor used for a light receiving layer are varied.

Mercury cadmium tellurium (MCT) is a material used for many years, and has advantages of high sensitivity and low noise. MCT is, however, highly toxic and further chemically unstable, thus there is a problem in that yield of infrared detectors is low.

Meanwhile, an infrared detector called a quantum well infrared photodetector (QWIP) is also known. QWIP is a device that uses a stacked-layer film for a light receiving layer, the stacked-layer film being obtained by alternately stacking a barrier layer and a quantum well layer in multiple layers. QWIP performs photoelectric conversion by optical absorption between sub-bands in the quantum well layers. The materials for a quantum well layer and a barrier layer includes gallium arsenide (GaAs) and indium phosphide (InP). These materials have advantages of low toxic as well as capability of improving the yield of infrared detectors because the materials are chemically stable.

In the QWIP, it is expected that increasing the number of stacked barrier layers and quantum well layers causes the number of carriers to be increased, and the sensitivity is enhanced. However, when the number of stacked layers is increased, carriers re-trapped in the quantum well layers are also increased in number, and it is known that the sensitivity of QWIP is saturated with a certain number of stacked layers.

Related techniques are disclosed in "B. F. Levine, "Quantum-well infrared photodetectors", Journal of Applied Physics 74, R1 (1993)".

SUMMARY

According to an aspect of the embodiments, an infrared detector includes, a substrate, a lower contact layer formed on the substrate, a first light receiving layer that is formed on the lower contact layer and has a quantum well structure, an intermediate contact layer formed on the first light receiving layer, a second light receiving layer that is formed on the intermediate contact layer and has a quantum well structure, and an upper contact layer formed on the second light receiving layer. Each of the first light receiving layer and the second light receiving layer includes, a first semiconductor layer that is doped with a first conductivity-type impurity, and a second semiconductor layer that is formed on the first semiconductor layer, and is doped with a second conductivity-type impurity which compensates the first conductivity-type impurity.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 2A and 2B are each a cross-sectional view (part 1) of an infrared image sensor, during a manufacturing process, according to a first embodiment;

FIGS. 3A and 3B are each a cross-sectional view (part 2) of the infrared image sensor, during a manufacturing process, according to the first embodiment;

FIG. 22 is a table for explaining a variation in material and impurity of each layer of an imaging device according to the first embodiment;

FIGS. 25A and 25B are each a cross-sectional view (part 2) of the infrared image sensor, during a manufacturing process, according to the second embodiment;

FIG. 29 is a table for explaining a variation in material and impurity of each layer of an imaging device according to the second embodiment;

DESCRIPTION OF EMBODIMENTS

The matter investigated by the inventor of the present application will be described before a description of the present embodiment is given.

Figure 1:
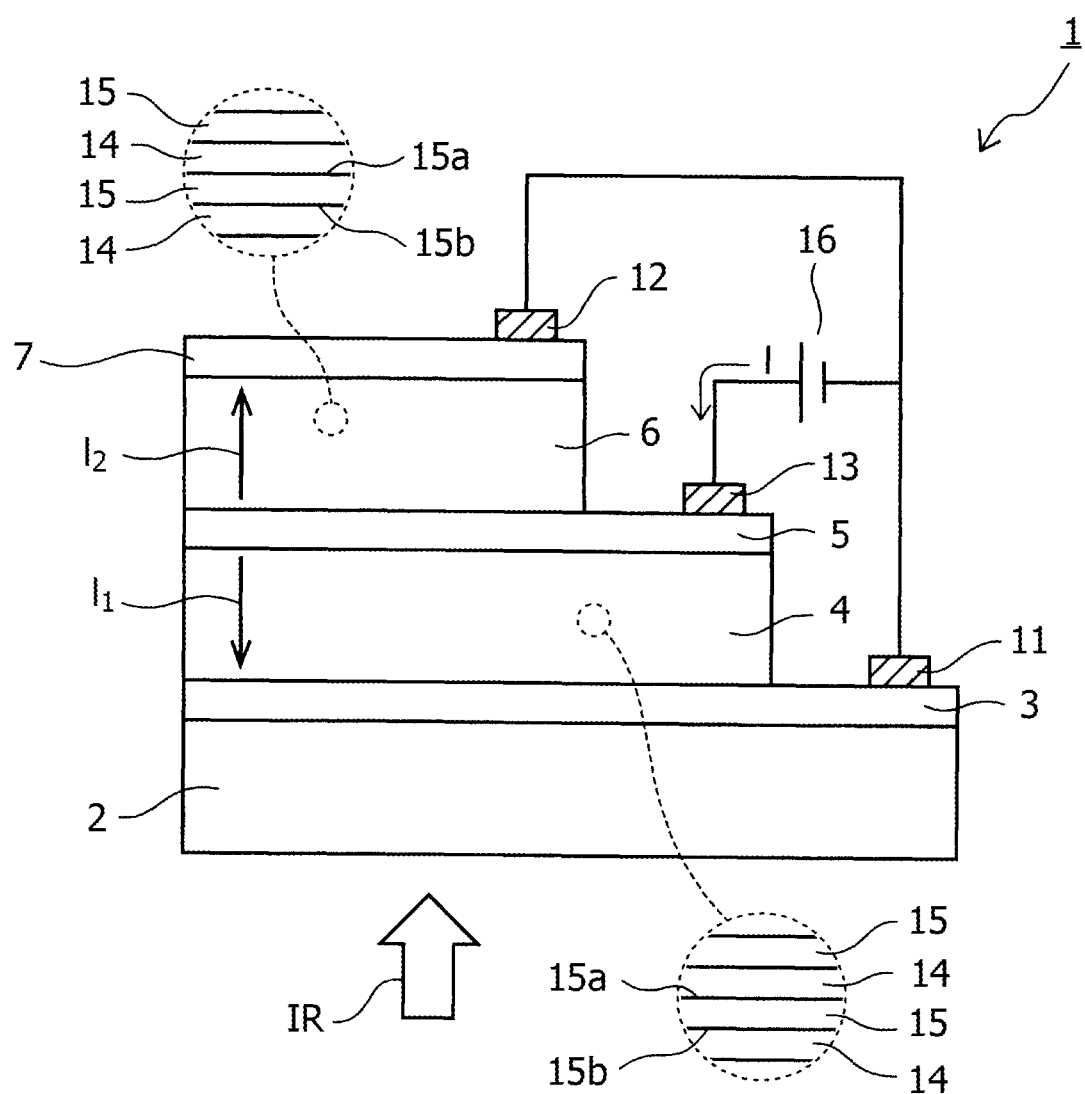
FIG. 1 is a cross-sectional view of an infrared detector used for investigation.

FIG. 1 is a cross-sectional view of an infrared detector used for investigation.

An infrared detector 1 is a QWIP, and a lower contact layer 3, a first light receiving layer 4, an intermediate contact layer 5, a second light receiving layer 6, and an upper contact layer 7 are formed in that order on a substrate 2.

Among these, for instance, a semi-insulating GaAs substrate is used as the substrate 2. The lower contact layer 3, the intermediate contact layer 5, and the upper contact layer 7 are each an n-type GaAs layer, and emitter electrodes 11, 12 and a collector electrode 13 are provided in corresponding ends of the contact layers 3, 7, and 5, respectively.

On the other hand, the first light receiving layer 4 and the second light receiving layer 6 each have a quantum well structure in which a barrier layer 14 and a quantum well layer 15 are alternately stacked in multiple layers. In this example, an aluminum gallium arsenide (AlGaAs) layer is formed as the barrier layer 14. Also, the barrier layer 14 is doped with Si (silicon) simultaneously with film formation, the Si serving as the n-type impurity for generating carriers (electrons). In contrast, the quantum well layer 15 is an i-type GaAs layer which is not doped with impurities.

In such an infrared detector 1, a positive voltage is applied to the collector electrode 13 by a DC power supply 16, and a negative voltage is applied to each of the collector electrodes 11, 12, and thereby bias voltages having the same magnitude and opposite directions are applied to the light receiving layers 4, 6. Consequently, a configuration is obtained, which is equivalent to the configuration of the light receiving layers 4, 6 which are electrically connected in parallel.

In this state, infrared light IR is incident on the substrate 2, and carriers are thereby generated in the light receiving layers 4, 6, and a current I, which is the total of currents $I_1$, $I_2$ flowing through respective light receiving layers 4, 6, flows through the collector electrode 13.

At this point, as described above, even when carriers are increased in number by increasing the number of stacked barrier layers 14 and quantum well layers 15, the carriers re-trapped in the quantum well layers 15 are also increased in number. Thus, the sensitivity of the light receiving layers 4, 6 is saturated with a certain number of stacked layers. For this reason, in this example, the number of stacked barrier layers 14 and quantum well layers 15 in the light receiving layers 4, 6 is made smaller than the number of stacked layers for which the sensitivity is saturated.

Consequently, the current I is obtained, which is the total of the currents $I_1$, $I_2$ before the sensitivity is saturated, and high sensitivity of the infrared detector 1 may be achieved.

Here, when the number of stacked barrier layers 14 and quantum well layers 15 is the same between the first light receiving layer 4 and the second light receiving layer 6, and a bias voltage having the same magnitude is applied to these light receiving layers 4, 6, the values of the currents $I_1$, $I_2$ flowing through the light receiving layers 4, 6 are supposed to be the same. According to trial calculation of the inventor of the present application, when the values of the currents $I_1$, $I_2$ are the same, the S/N ratio of the current I is improved by 1.2 times, as compared with when only one of the first light receiving layer 4 and the second light receiving layer 6 is formed, in which the sensitivity is saturated.

However, study of the inventor of the present application even when a bias voltage having the same magnitude is applied to the light receiving layers 4, 6, the current $I_1$ becomes lower than the current $I_2$, and the current I is decreased, as compared with when the both currents $I_1$, $I_2$ are the same.

This is probably because a quantum well layer 15 grows on a barrier layer 14 while taking Si of the barrier layer 14, thus the concentration of Si is higher in a barrier layer 14 near an upper surface 15a of the quantum well layer 15 than in a barrier layer 14 near a lower surface 15b. Thus, the concentration of Si is asymmetric in a vertical direction of the quantum well layer 15, and the Fermi levels are different between the upper surface 15a and the lower surface 15b. As a consequence, an effective barrier height is different between carriers flowing in an upward direction of the substrate and carriers flowing in a downward direction of the substrate, and the current $I_1$ becomes lower than the current $I_2$ as described above.

When the current $I_1$ becomes lower like this, the current I, which is the total of the current $I_1$ and the current $I_2$, also becomes lower, and it is difficult to sufficiently increase the sensitivity of the infrared detector 1.

Hereinafter, the embodiments will be described.

First Embodiment

An infrared image sensor according to this embodiment will be described by following its manufacturing process.

FIGS. 2A to 13 are each a cross-sectional view of the infrared image sensor, during a manufacturing process, according to this embodiment.

In FIGS. 2A to 13, cross-sections of a pixel area I in which multiple pixels are formed and a peripheral area II of the pixel area I are illustrated. Hereinafter, a GaAs/AlGaAs based QWIP, in which a GaAs layer is used for a quantum well layer and an AlGaAs layer is used for a barrier layer, will be described.

First, as illustrated in FIG. 2A, a semi-insulating GaAs substrate is prepared as the substrate 20, then the substrate 20 is placed in a solid source molecular beam epitaxy (SS-MBE) apparatus (not illustrated), and the temperature is increased. Although the plane direction of the substrate 20 is not particularly limited, the surface of the substrate 20 is (001) plane in this example.

In order to protect As (arsenic) atoms against removal from the substrate 20 due to temperature increase, when the substrate temperature reaches 400° C., an As beam is emitted to the surface of the substrate 20. Subsequently, the temperature is further continued to be increased while an As beam is being emitted to the substrate 20, and a GaAs oxide film on the surface of the substrate 20 is dissociated and removed. Dissociation of a GaAs oxide film starts when the substrate temperature reaches approximately 600° C., and the GaAs oxide film dissociates substantially completely by maintaining a state in which the substrate temperature is 620° C. for approximately 20 minutes.

Subsequently, a beam of each of As and Ga (gallium) is emitted to the substrate 20 under the condition that the substrate temperature is 600° C., thereby forming a GaAs layer with a thickness of approximately 500 nm as a buffer layer 21 on the substrate 20.

Subsequently, a beam of each of As, Ga, and Si is emitted to the substrate 20 while maintaining a state in which the substrate temperature is 600° C., thereby forming a Si-doped GaAs layer with a thickness of approximately 1000 nm, and let an n-type lower contact layer 22 be the GaAs layer.

Although the concentration of an n-type impurity, with which the lower contact layer 22 is doped, is not particularly limited, Si is doped as the n-type impurity at a concentration of $1.0 \times 10^{18}$ cm$^{-3}$ in this example.

Subsequently, the step illustrated in FIG. 2B will be described.

First, a state in which the substrate temperature is 600° C. is maintained while the above-mentioned SS-MBE apparatus is being continuously used. In this state, a beam of each of Al (aluminum), Ga, and As is emitted to the surface of the lower contact layer 22, thereby forming an i-type $Al_{0.25}Ga_{0.75}As$ layer not containing impurities with a thickness of approximately 20 nm as a first barrier layer 23.

In addition, a beam of Si which is an n-type impurity is emitted to the surface of the first barrier layer 23 while a beam of each of Al, Ga, and As is being emitted to the surface of the first barrier layer 23, thereby forming an n-type $Al_{0.25}Ga_{0.75}As$ layer with a thickness of approximately 10 nm, and let a second barrier layer 24 be the $Al_{0.25}Ga_{0.75}As$ layer. The Si, with which the second barrier layer 24 is doped, has a function of generating carriers (electrons), and Si is doped at a concentration of approximately $1.0 \times 10^{18}$ cm$^{-3}$ in this example.

It is to be noted that Si is an example of a first conductivity-type impurity, and the second barrier layer 24 is an example of a first semiconductor layer.

Subsequently, emission of the Si beam is stopped, and a beam of each of Al, Ga, and As only is emitted to the surface of the second barrier layer 24, thereby forming an i-type $Al_{0.25}Ga_{0.75}As$ layer with a thickness of approximately 0.5 nm, and let a lower layer 25a of a third barrier layer 25 be the $Al_{0.25}Ga_{0.75}As$ layer.

In addition, a beam of each of Al, Ga, As, and Be (beryllium) is emitted to the surface of the lower layer 25a, thereby forming a p-type $Al_{0.25}Ga_{0.75}As$ layer with a thickness of approximately 0.5 nm, doped with Be at a concentration of approximately $6.0 \times 10^{17}$ cm$^{-3}$, and let an intermediate layer 25b of the third barrier layer 25 be the $Al_{0.25}Ga_{0.75}As$ layer.

After emission of the Be beam is stopped, a beam of each of Al, Ga, and As only is emitted to the surface of the intermediate layer 25b, thereby forming an i-type $Al_{0.25}Ga_{0.75}As$ layer with a thickness of approximately 19 nm, and let an upper layer 25c of the third barrier layer 25 be the $Al_{0.25}Ga_{0.75}As$ layer.

The third barrier layer 25 is an example of a second semiconductor layer, and a p-type impurity, Be with which the intermediate layer 25b is doped is an example of a second conductivity-type impurity that compensates Si which is an n-type impurity.

In the steps so far, a barrier layer 26 is obtained, in which the first to third barrier layers 23 to 25 are stacked in that order.

Next, after emission of Al is stopped in the above-mentioned SS-MBE apparatus, a beam of each of Ga and As is emitted to the surface of barrier layer 26, thereby forming an i-type GaAs layer with a thickness of approximately 10 nm as a quantum well layer 27.

Subsequently, a first light receiving layer 31 is formed by alternately stacking the above-mentioned barrier layer 26 and quantum well layer 27 in multiple layers. Although the number of stacked barrier layers 26 and quantum well layers 27 in the first light receiving layer 31 is not particularly limited, each of the barrier layer 26 and the quantum well layer 27 is stacked in approximately 30 layers in this example.

Subsequently, as illustrated in FIG. 3A, a beam of each of Ga, As, and Si is emitted to the surface of the first light receiving layer 31 while maintaining the substrate temperature at 600° C. in the above-mentioned SS-MBE apparatus, and an n-type GaAs layer with a thickness of approximately 1000 nm is formed as an intermediate contact layer 32. The concentration of Si in the intermediate contact layer 32 is, for instance, approximately $1.0 \times 10^{18}$ cm$^{-3}$.

Subsequently, as illustrated in FIG. 3B, a second light receiving layer 33 is formed on the intermediate contact layer 32 by performing the same steps as those by which the first light receiving layer 31 is formed. The layer structure of the second light receiving layer 33 is the same as that of the first light receiving layer 31, and the second light receiving layer 33 is formed by stacking each of the barrier layer 26 and the quantum well layer 27 in approximately 30 layers.

Figure 4:
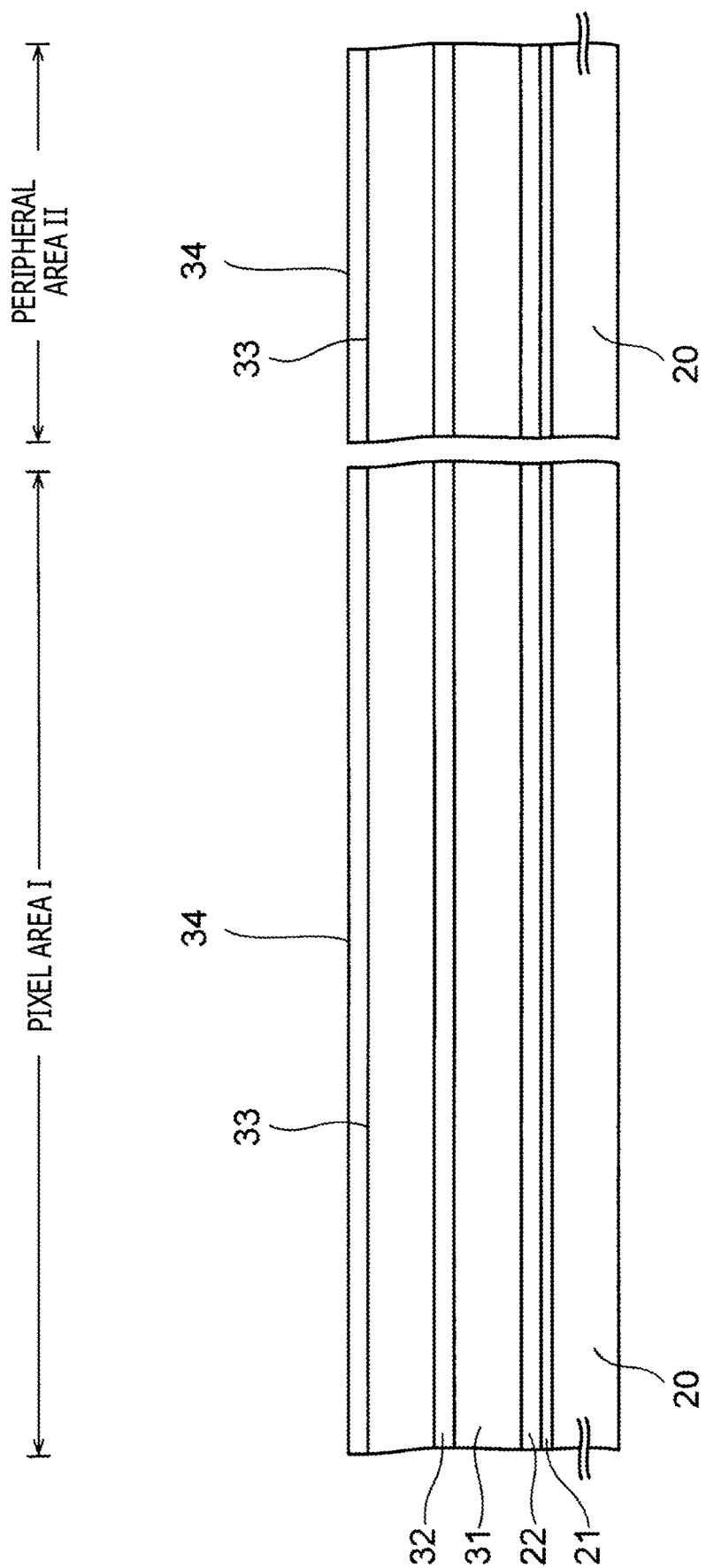
FIG. 4 is a cross-sectional view (part 3) of the infrared image sensor, during a manufacturing process, according to the first embodiment.

Subsequently, as illustrated in FIG. 4, a beam of each of Ga, As, and Si is emitted to the surface of the second light receiving layer 33 while maintaining the substrate temperature at 600° C. in the above-mentioned SS-MBE apparatus, and an n-type GaAs layer with a thickness of approximately 1000 nm is formed, and let an upper contact layer 34 be the GaAs layer.

Next, the substrate 20 is taken out from the SS-MBE apparatus.

In the steps so far, a structure is completed in which the contact layers 22, 32, 34 and the light receiving layers 31, 33 are alternately stacked. Among these, the first light receiving layer 31 and the second light receiving layer 33 are layers that generate carriers by utilizing optical absorption between sub-bands in the quantum well layers 27. The contact layers 22, 32, 34 are layers for taking the carriers generated in the light receiving layers 31, 33 to the outside.

Figure 5:
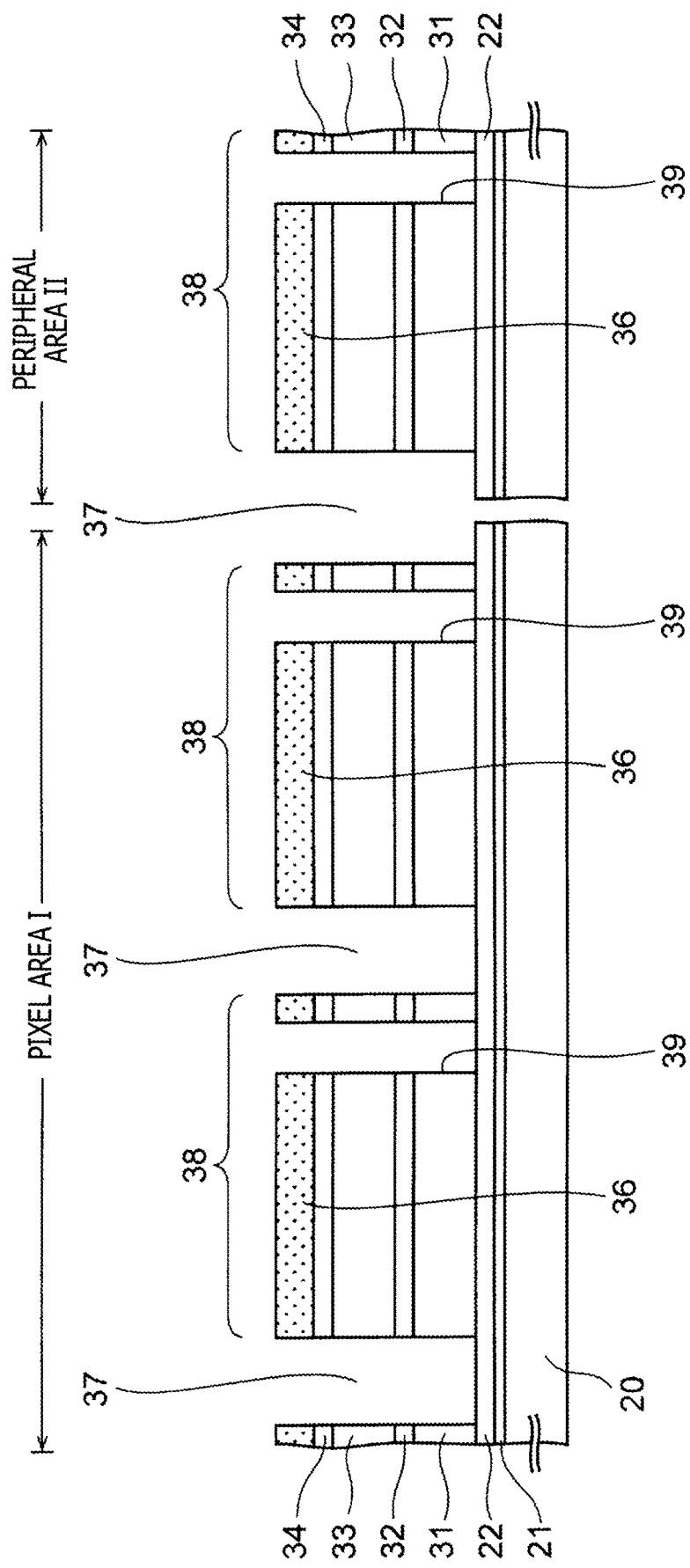
FIG. 5 is a cross-sectional view (part 4) of the infrared image sensor, during a manufacturing process, according to the first embodiment.

Subsequently, as illustrated in FIG. 5, photoresist is applied onto the upper contact layer 34, and first resist layers 36 are formed by exposing the photoresist to light and developing the photoresist.

Then dry etching is performed on the upper contact layer 34 to the first light receiving layer 31 using the first resist layer 36 as a mask, and element separation grooves 37 are formed in these layers.

In the dry etching, carbon tetrafluoride ($CF^4$) gas is used as an etching gas, and multiple pixels 38 are defined by the element separation grooves 37. Each of the pixels 38 has a square shape in a plan view, and the length of each side is approximately 50 μm.

Furthermore, in the dry etching, a first contact hole 39 having a depth reaching the lower contact layer 22 is formed in each pixel 38.

Subsequently, the first resist layer 36 is removed.

Figure 6:
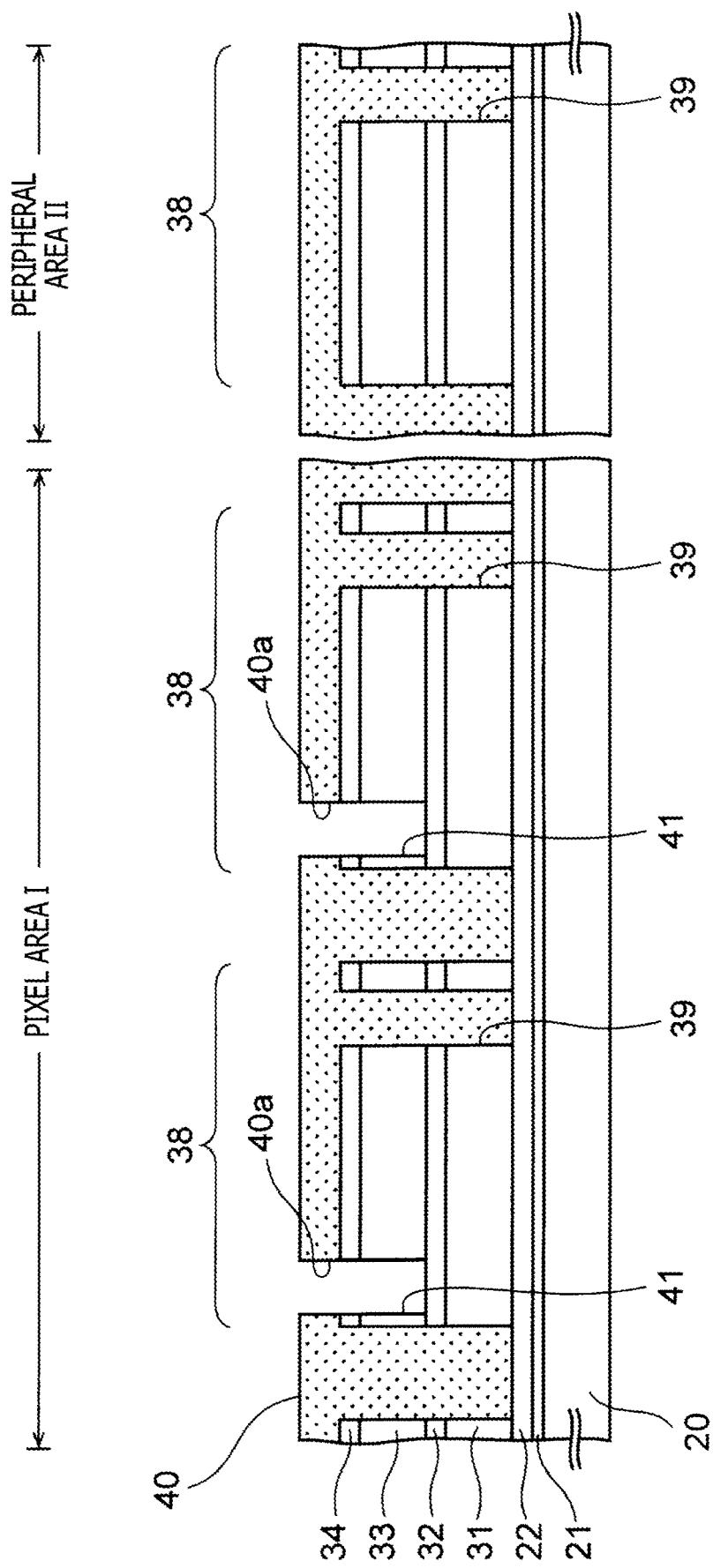
FIG. 6 is a cross-sectional view (part 5) of the infrared image sensor, during a manufacturing process, according to the first embodiment.

Subsequently, as illustrated in FIG. 6, photoresist is applied to the entire upper-side surface of the substrate 20, and a second resist layer 40 including an opening 40a on each pixel 38 is formed by exposing the photoresist to light and developing the photoresist.

Then, dry etching is performed on each of the second light receiving layer 33 and the upper contact layer 34 through the opening 40a while using $CF^4$ gas as an etching gas, and a second contact hole 41 having a depth reaching the intermediate contact layer 32 is formed in the pixel area I. It is to be noted that the second contact hole 41 is not formed in the peripheral area II.

After dry etching is completed, the second resist layer 40 is removed.

Figure 7:
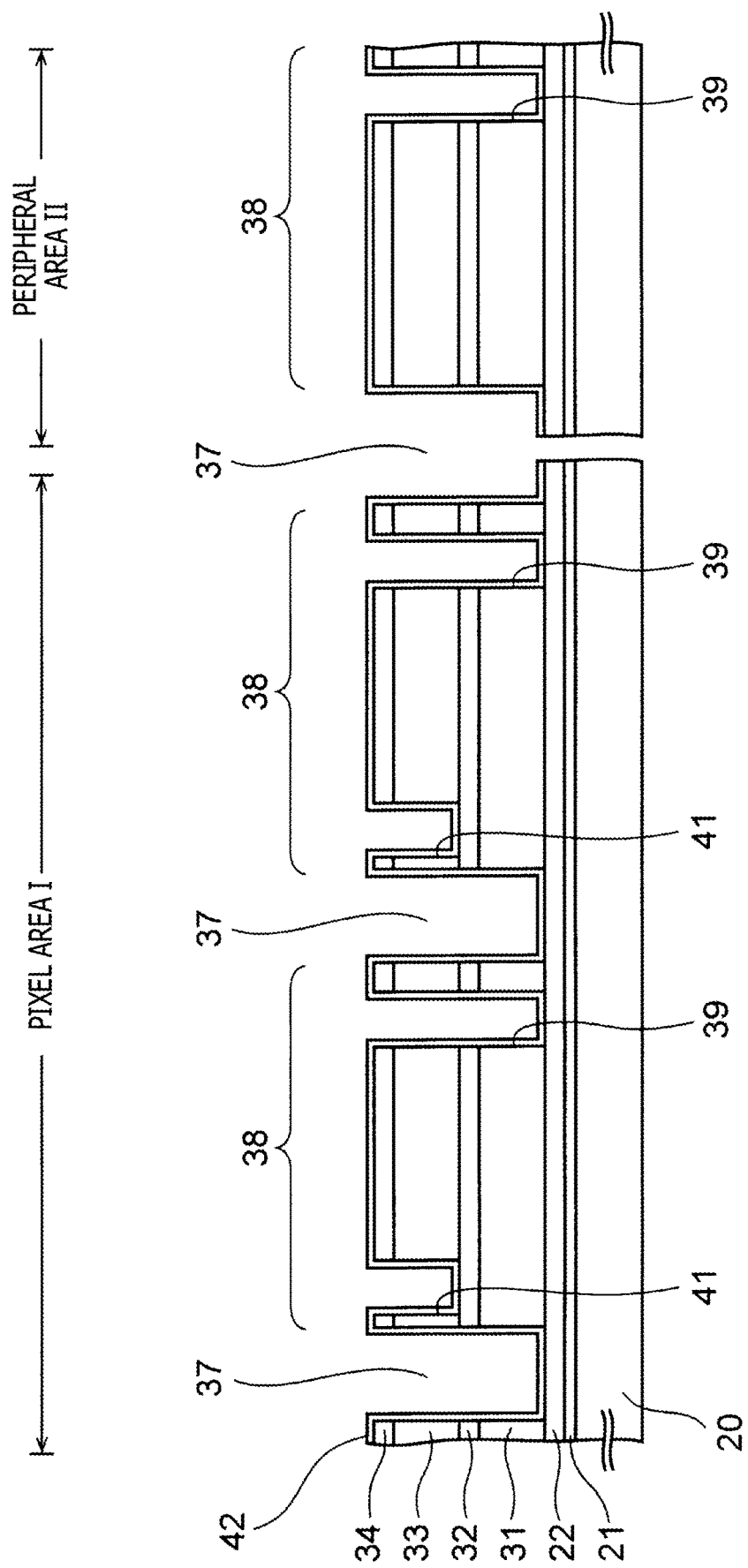
FIG. 7 is a cross-sectional view (part 6) of the infrared image sensor, during a manufacturing process, according to the first embodiment.

Subsequently, as illustrated in FIG. 7, a silicon dioxide ($9O_2$) layer with a thickness of approximately 100 nm is formed as a passivation layer 42 on the entire upper-side surface of the substrate 20 by a chemical vapor deposition (CVD) method. The inner surface of each of the element separation grooves 37 and the holes 39, 41, and the upper surface of the upper contact layer 34 are covered with the passivation layer 42.

Figure 8:
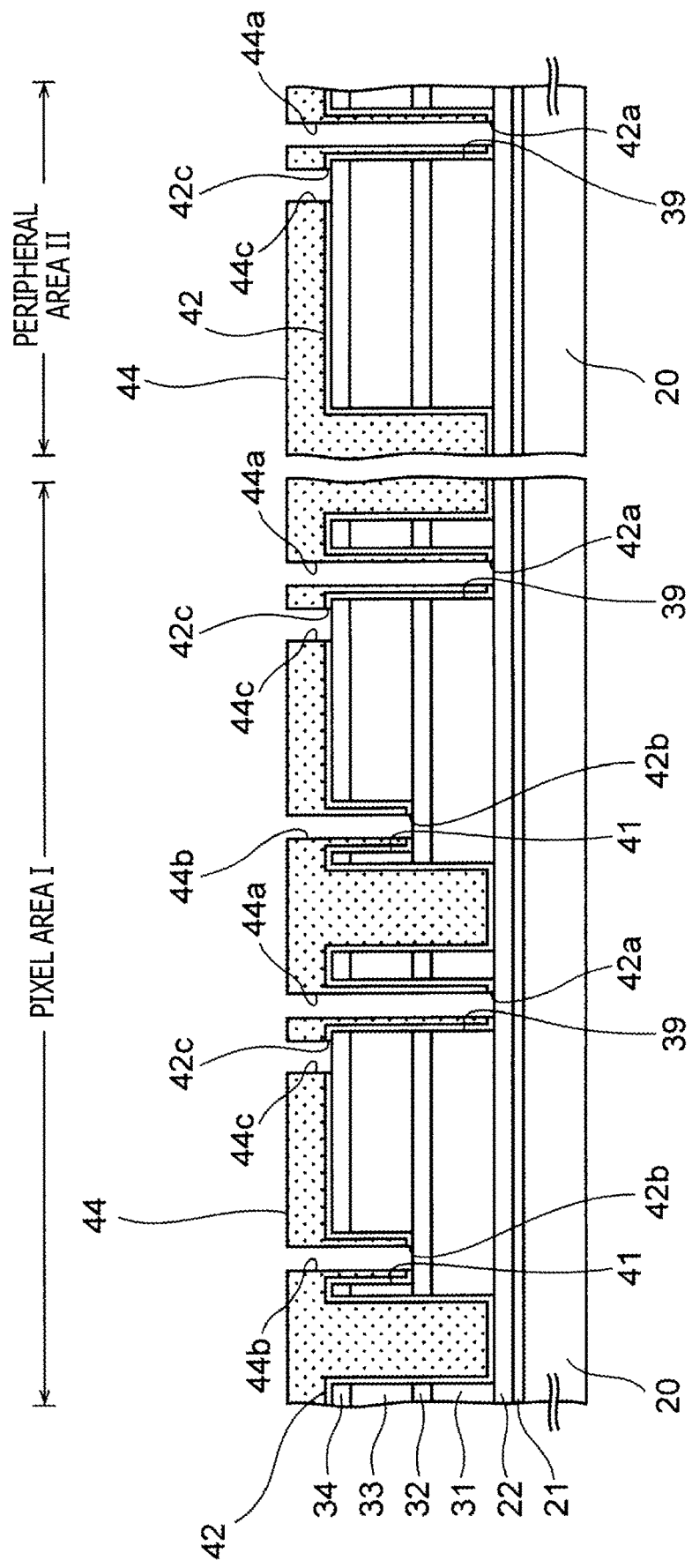
FIG. 8 is a cross-sectional view (part 7) of the infrared image sensor, during a manufacturing process, according to the first embodiment.

Next, as illustrated in FIG. 8, photoresist is applied onto the passivation layer 42, and third resist layers 44 each including openings 44a to 44c are formed by exposing the photoresist to light and developing the photoresist. Among these openings 44a to 44c, the openings 44a, 44b are formed at positions overlapping with the first and second contact holes 39, 41. In addition, the opening 44c is formed at a position near the first contact hole 39 in each pixel 38.

Then wet etching is performed through the openings 44a to 44c on the passivation layer 42 below the openings 44a to 44c while using buffered hydrofluoric acid as the etchant, thereby forming openings 42a to 42c in the passivation layer 42.

Subsequently, the third resist layers 44 are removed.

Figure 9:
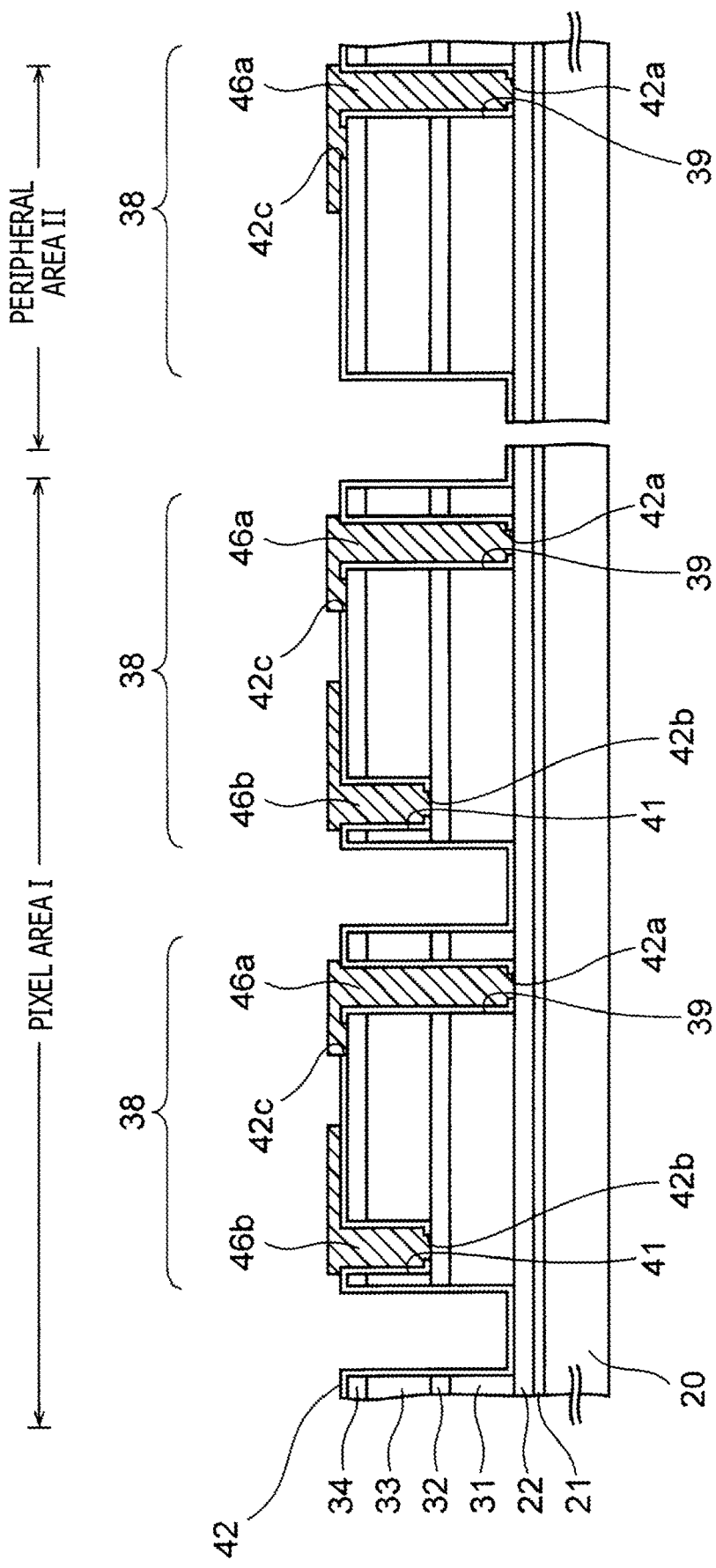
FIG. 9 is a cross-sectional view (part 8) of the infrared image sensor, during a manufacturing process, according to the first embodiment.

Subsequently, as illustrated in FIG. 9, a metal stacked-layer film is formed on the entire upper-side surface of the substrate 20 by a sputtering method, and patterning is further performed on the metal stacked-layer film by a liftoff method, thereby forming a first electrode 46a and a second electrode 46b in the first and second contact holes 39, 41, respectively in the pixel area I. For instance, a titanium layer, a platinum layer, and a gold layer are formed as the metal stacked-layer film in that order.

It is to be noted that in the peripheral area II, only the first electrode 46a is formed and the second electrode 46b is not formed.

Among the above-mentioned electrodes, the first electrode 46a is electrically connected to each of the lower contact layer 22 and the upper contact layer 34 through each of the openings 42a and 42c of the passivation layer 42, thus these contact layers 22, 34 are electrically connected to each other.

In contrast, the second electrode 46b is electrically connected to the intermediate contact layer 32 through the opening 42b of the passivation layer 42.

Figure 10:
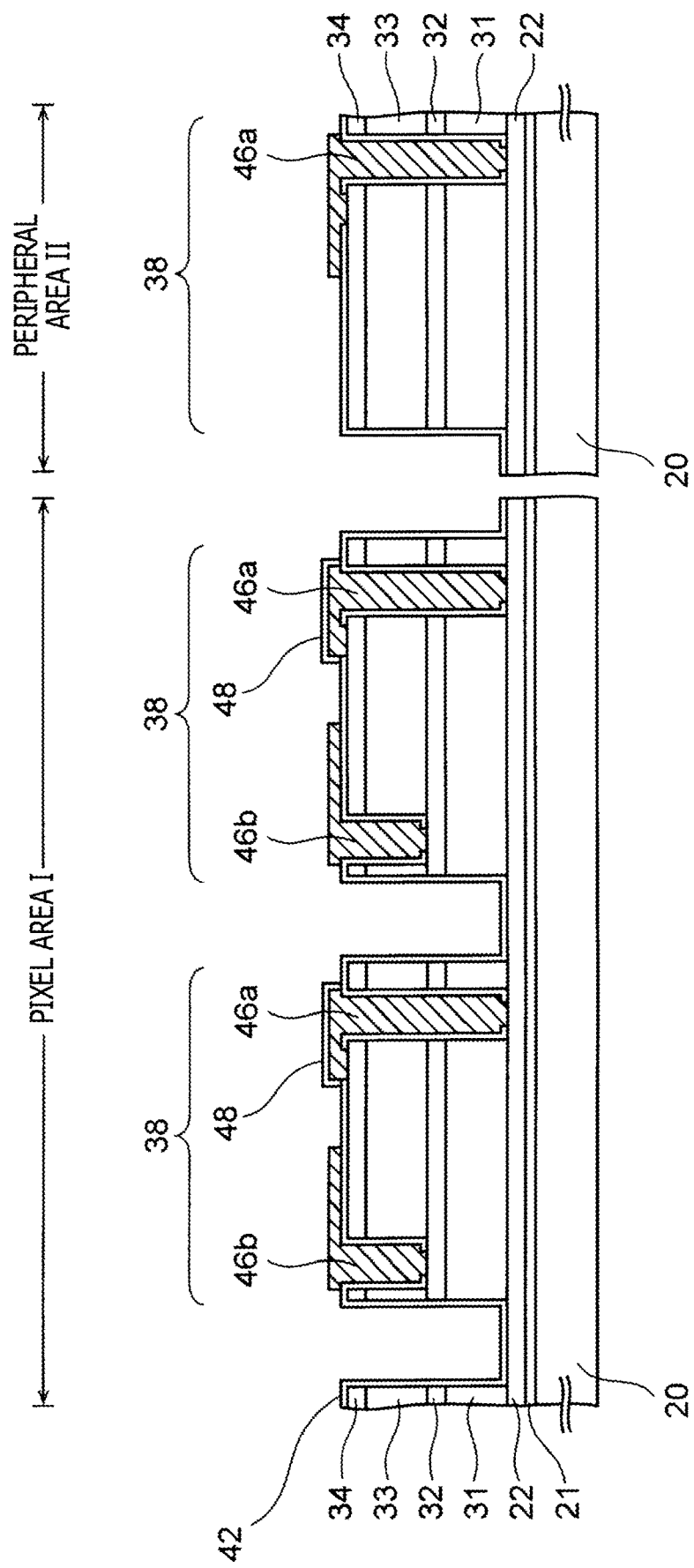
FIG. 10 is a cross-sectional view (part 9) of the infrared image sensor, during a manufacturing process, according to the first embodiment.

Subsequently, as illustrated in FIG. 10, $SiO_2$ layers are formed each as an insulation layer 48 in the pixel area I by a CVD method, and patterning is further performed on the insulation layer 48 to leave only the upper surface and the lateral surface of the first electrode 46a. It is to be noted that the first electrode 46a in the peripheral area II is not covered with the insulation layer 48 and exposed.

Figure 11:
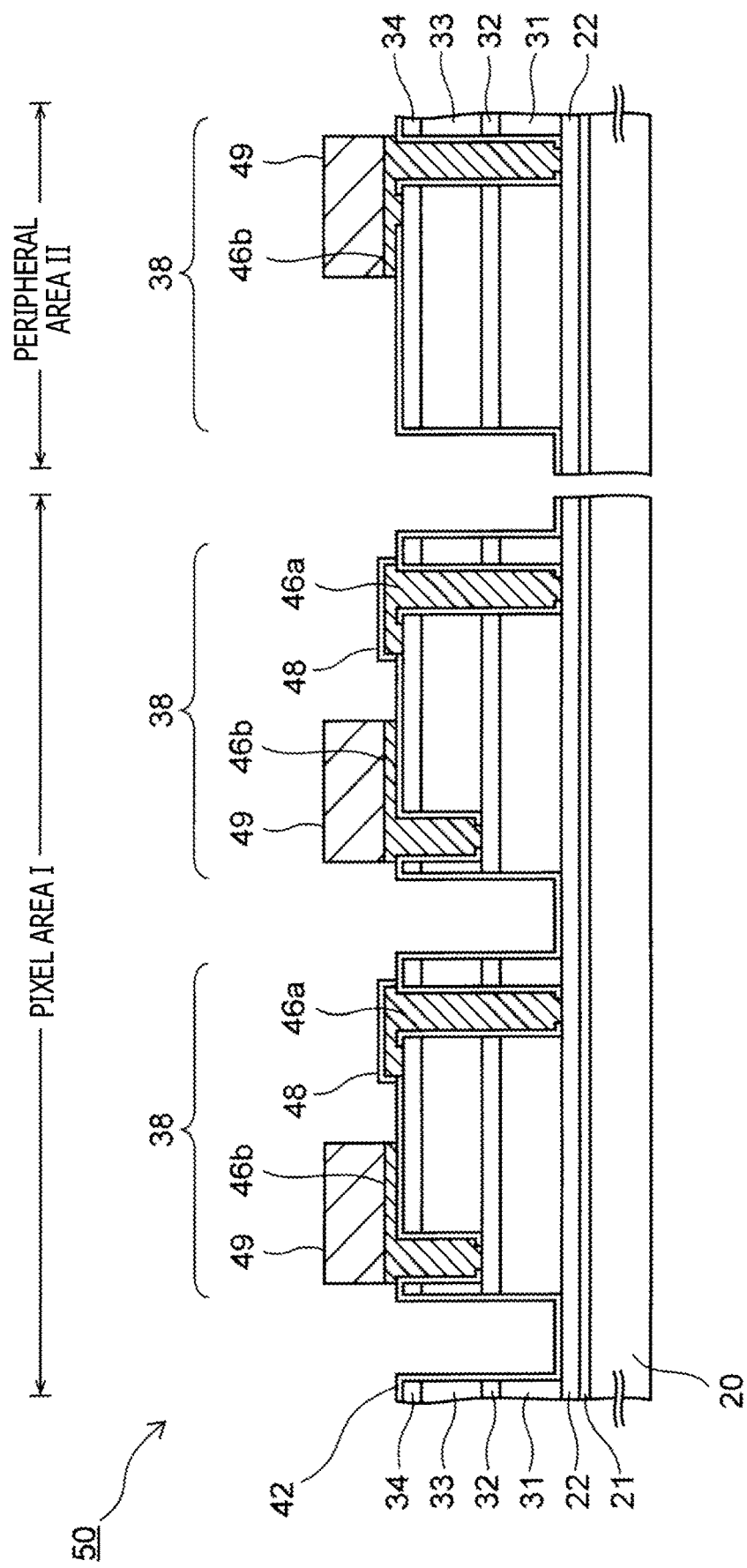
FIG. 11 is a cross-sectional view (part 10) of the infrared image sensor, during a manufacturing process, according to the first embodiment.

As illustrated in FIG. 11, an indium layer is formed as a terminal 49 on each of the second electrodes 46b in the pixel area I and the first electrode 46a in the peripheral area II by a vapor deposition method.

Subsequently, multiple imaging devices 50 are obtained by dicing the substrate 20 into individual pieces.

Figure 14:
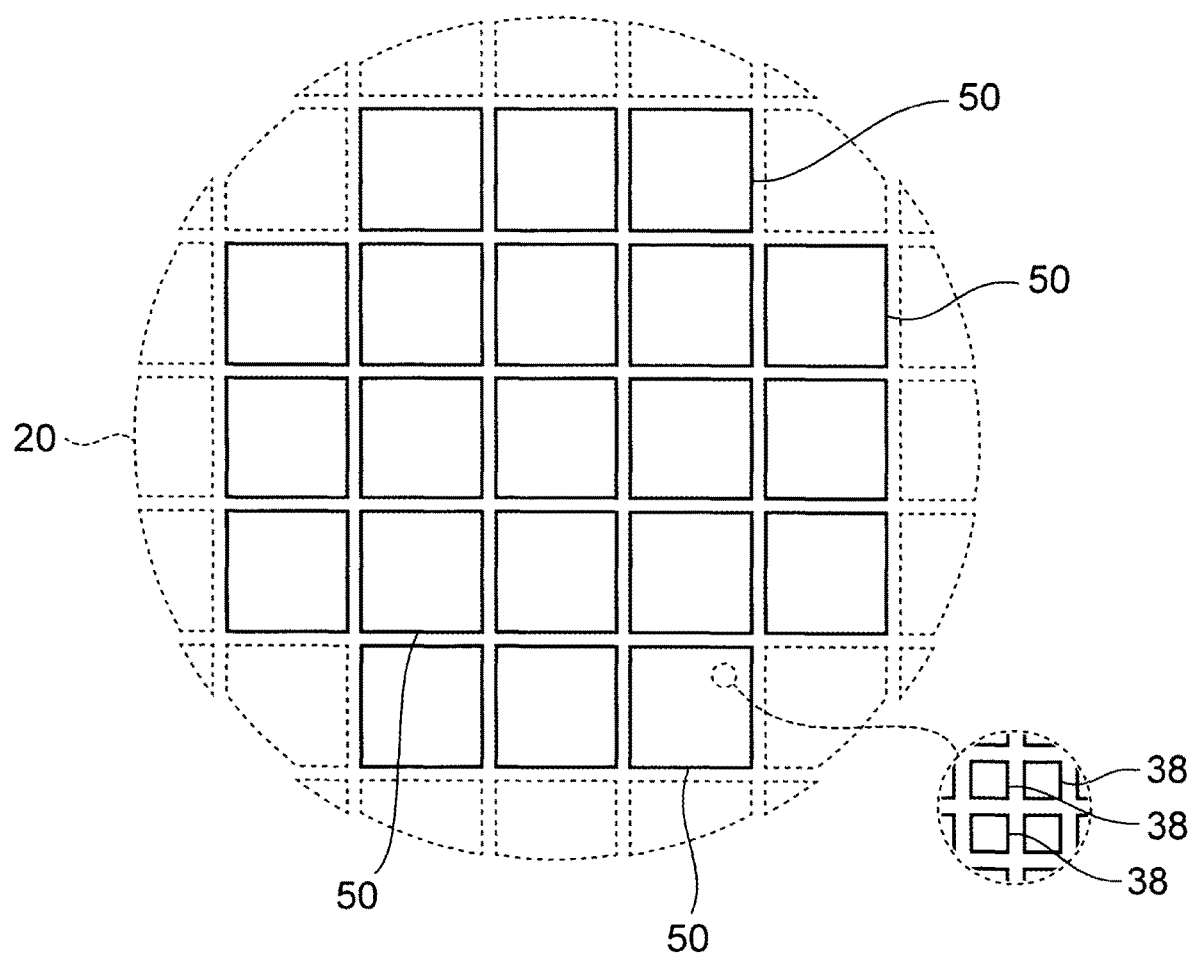
FIG. 14 is a plan view of multiple imaging devices obtained by dicing in the first embodiment.

FIG. 14 is a plan view of multiple imaging devices 50 obtained by dicing.

Each imaging device 50 is a focal plane array (FPA) chip in which multiple pixels 38 are arranged in an array, and multiple square-shaped imaging devices 50 are cut off from one substrate 20 by dicing.

Although the number of pixels 38 in one imaging device 50 is not particularly limited, 256×256 pixels 38 are provided in one imaging device 50 in this example. In this case, the total of the areas of the pixels 38 is 15.36 mm×15.36 mm. Each pixel 38 serves as an infrared detector that detects infrared light.

Figure 12:
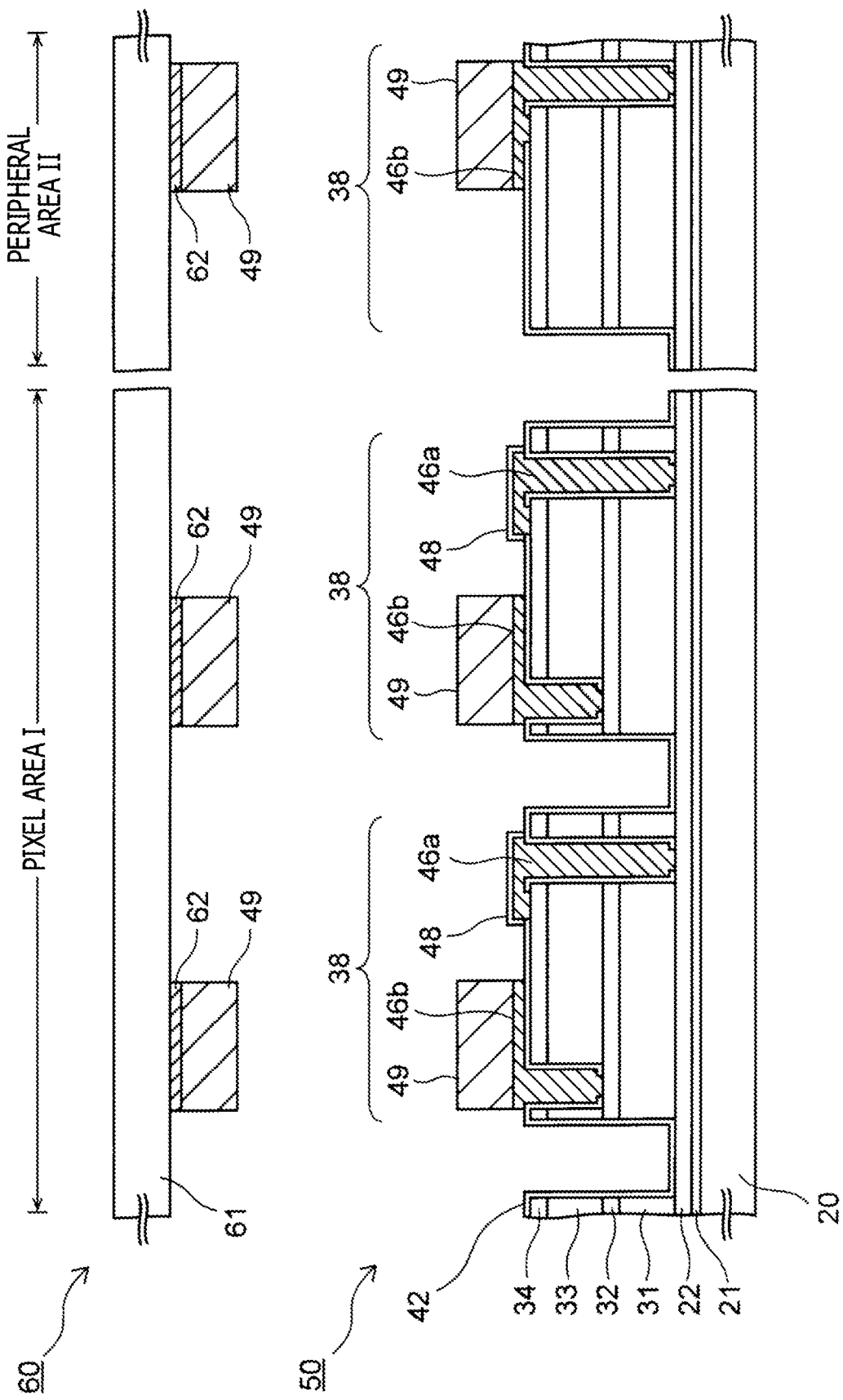
FIG. 12 is a cross-sectional view (part 11) of the infrared image sensor, during a manufacturing process, according to the first embodiment.

Next, as illustrated in FIG. 12, a circuit device 60 is prepared separately from the imaging device 50 described above.

In the circuit device 60, the later-described read circuit is formed beforehand, and the output of each pixel 38 is read by the read circuit. A semiconductor device thus including a read circuit is also called a read-out integrated circuit (ROIC) chip.

The circuit device 60 has a silicon substrate 61 and electrode pads 62 formed on the surface of the substrate. Among these, each electrode pad 62 is formed by patterning a copper plated film, for instance, and an indium layer is formed as a terminal 49 on the electrode pad 62 by a vapor deposition method.

The circuit device 60 is then disposed on the imaging device 50, and the terminals 49 of these devices are opposed to each other.

Figure 13:
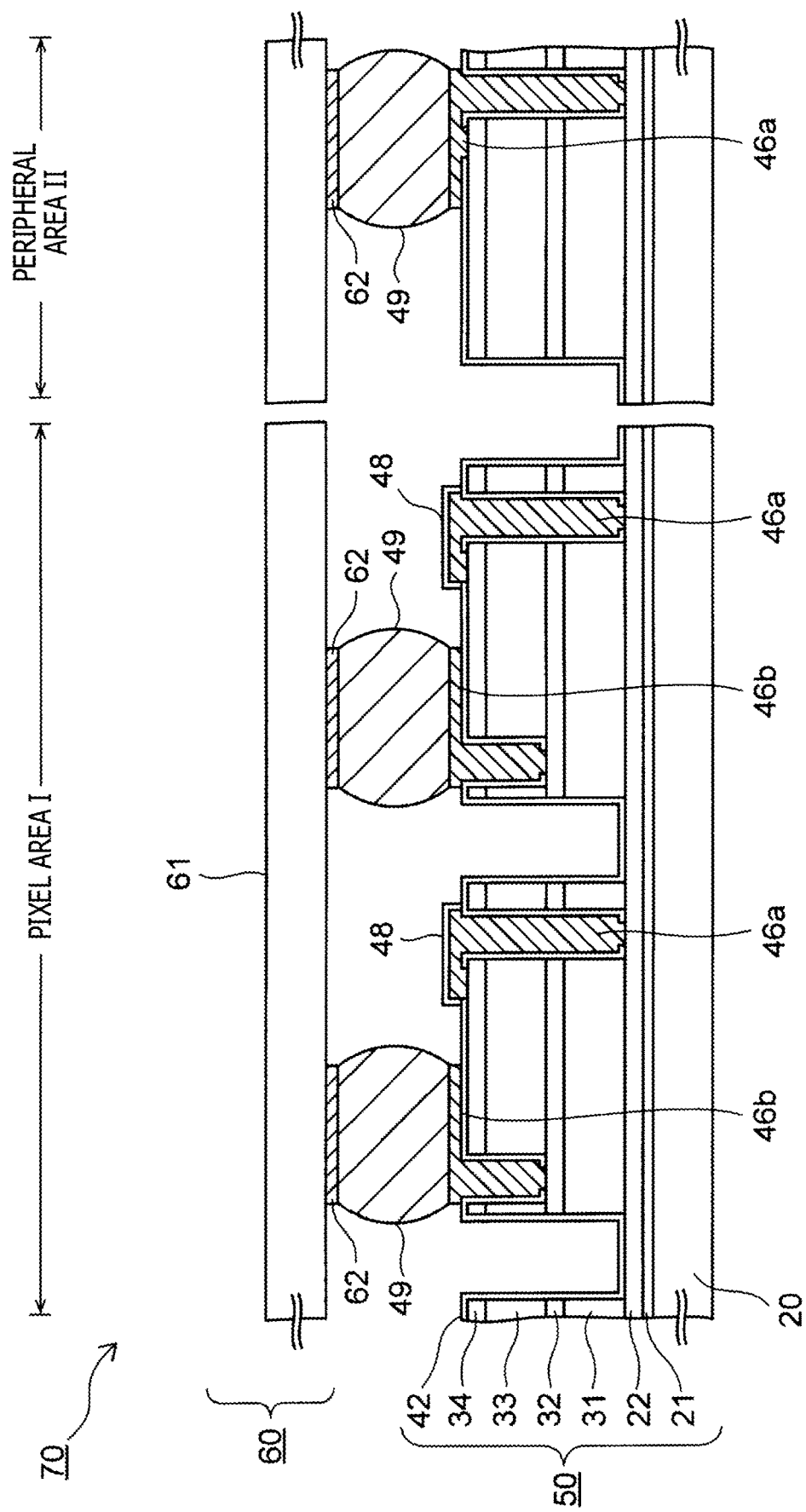
FIG. 13 is a cross-sectional view (part 12) of the infrared image sensor, during a manufacturing process, according to the first embodiment.

Subsequently, as illustrated in FIG. 13, the upper and lower terminals 49 are brought into contact with each other, then the terminals 49 are reflowed to have a bump shape, and the circuit device 60 is connected to the imaging device 50 via the terminals 49.

Although the temperature at the time of reflow is not particularly limited, each terminal 49 is heated to approximately 160° C. which is higher than the melting point (156.4° C.) of indium used as the material of the terminal 49.

Consequently, the basic structure of the infrared image sensor 70 according to the embodiment is completed.

Figure 15:
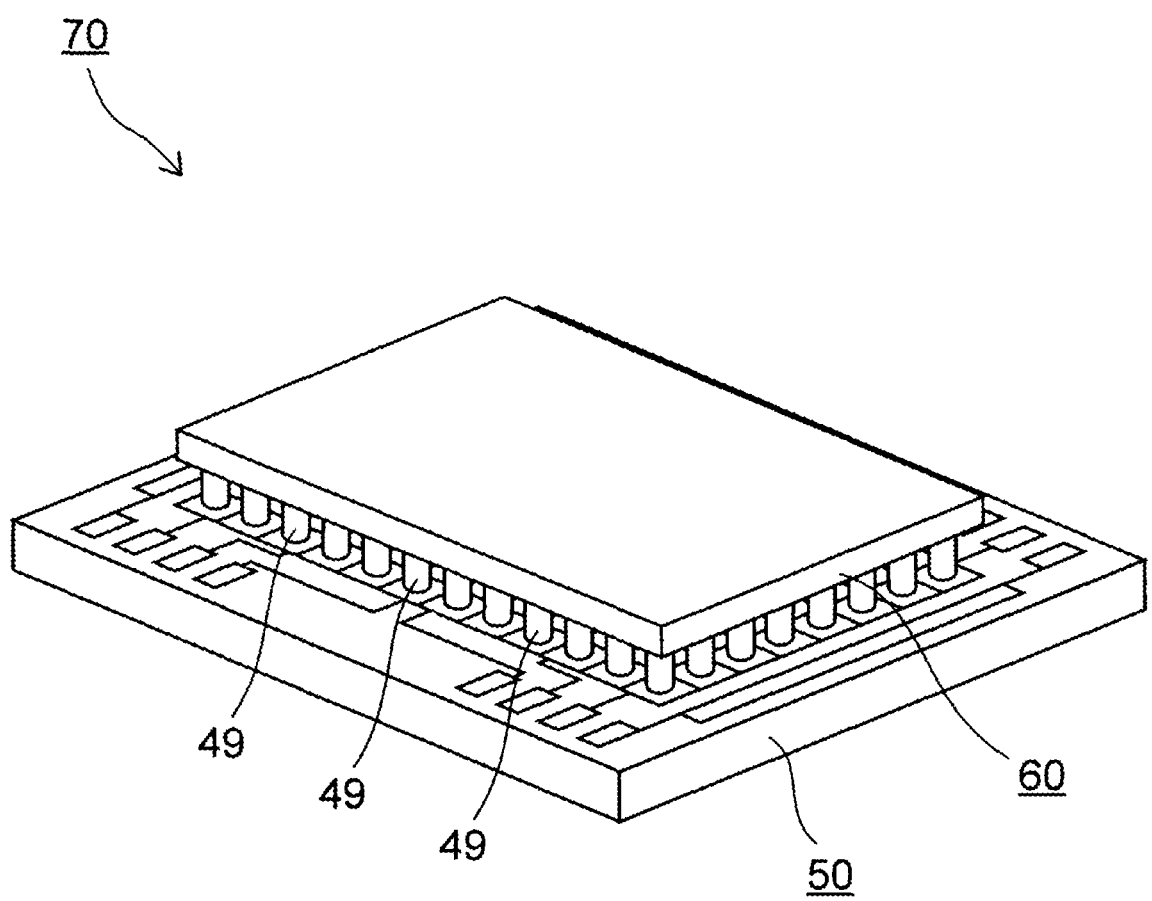
FIG. 15 is a perspective view of the infrared image sensor according to the first embodiment.

FIG. 15 is a perspective view of the infrared image sensor 70.

As illustrated in FIG. 15, the imaging device 50 and the circuit device 60 are connected to each other by the multiple terminals 49.

Figure 16:
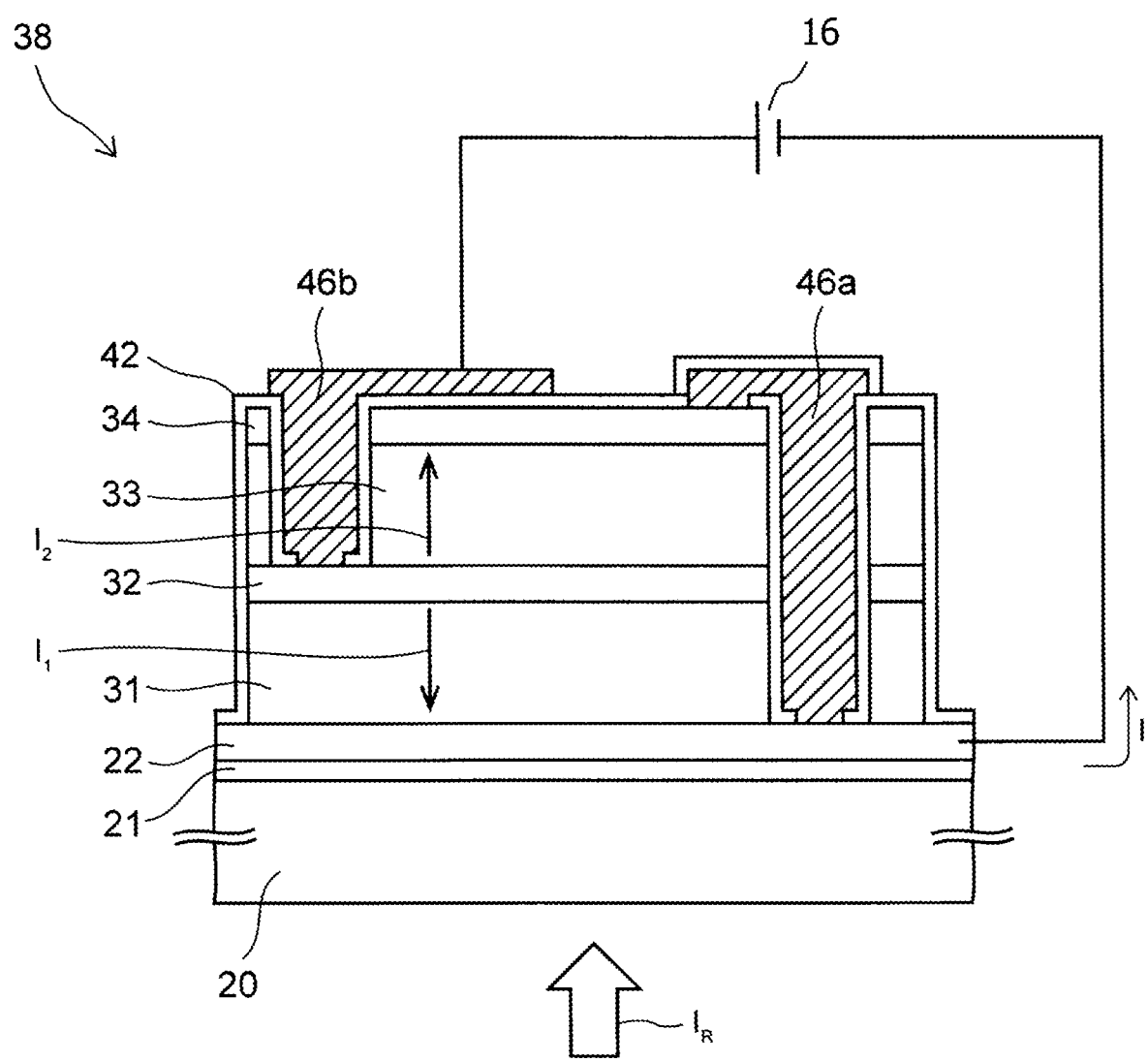
FIG. 16 is an enlarged cross-sectional view of a pixel in a pixel area for explaining the operation of the infrared image sensor according to the first embodiment.

FIG. 16 is an enlarged cross-sectional view of a pixel 38 in the pixel area I for explaining the operation of the infrared image sensor 70.

In actual use environment, a positive voltage of a DC power supply 16 is applied to the second electrode 46b via the circuit device 60 (see FIG. 13), and the positive voltage is applied to the intermediate contact layer 32. Along with this, a negative voltage of the DC power supply 16 is applied to the first electrode 46a (see FIG. 13) in the peripheral area II, and the negative voltage is applied to the lower contact layer 22.

Thus, bias voltages having the same magnitude and opposite directions are applied to the first light receiving layer 31 and the second light receiving layer 33, respectively, and in this state, infrared light IR is incident on the substrate 20, carriers (electrons) are thereby generated in the light receiving layers 31, 33, and currents $I_1$, $I_2$ flow through respective light receiving layers 31, 33.

Then the current I, which is the total of the currents $I_1$, $I_2$, is read from the first electrode 46a (see FIG. 13) in the peripheral area II by the circuit device 60, and the current I is amplified for each pixel in the circuit device 60.

Figure 17:
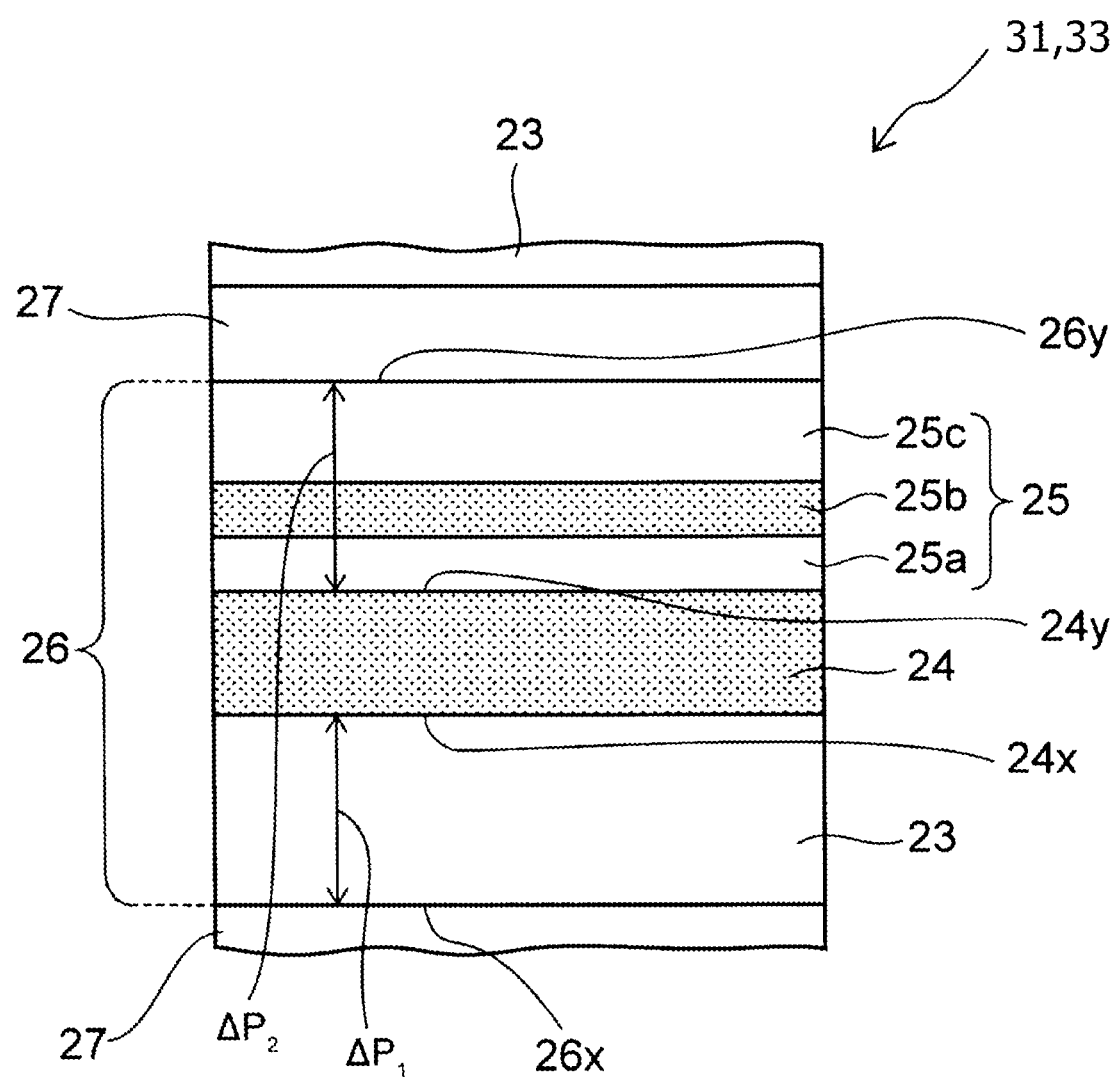
FIG. 17 is an enlarged cross-sectional view of a first light receiving layer and a second light receiving layer in the first embodiment.

FIG. 17 is an enlarged cross-sectional view of the first light receiving layer 31 and the second light receiving layer 33 in the embodiment.

As illustrated in FIG. 17, in the embodiment, the second barrier layer 24 is doped with Si as the n-type impurity, and carriers (electrons) are generated by the Si. Then, a p-type intermediate layer 25b is formed at a position near the second barrier layer 24 in the third barrier layer 25, the p-type intermediate layer 25b being doped with Be which has an opposite conductivity-type to Si.

It is to be noted that the position of the second barrier layer 24 in the barrier layer 26 is not particularly limited. In this example, a first interval $\Delta P_1$ between a lower surface 26x of the barrier layer 26 and a lower surface 24x of the second barrier layer 24 is set to be equal to a second interval $\Delta P_2$ between an upper surface 26y of the barrier layer 26 and an upper surface 24y of the second barrier layer 24.

Figure 18:
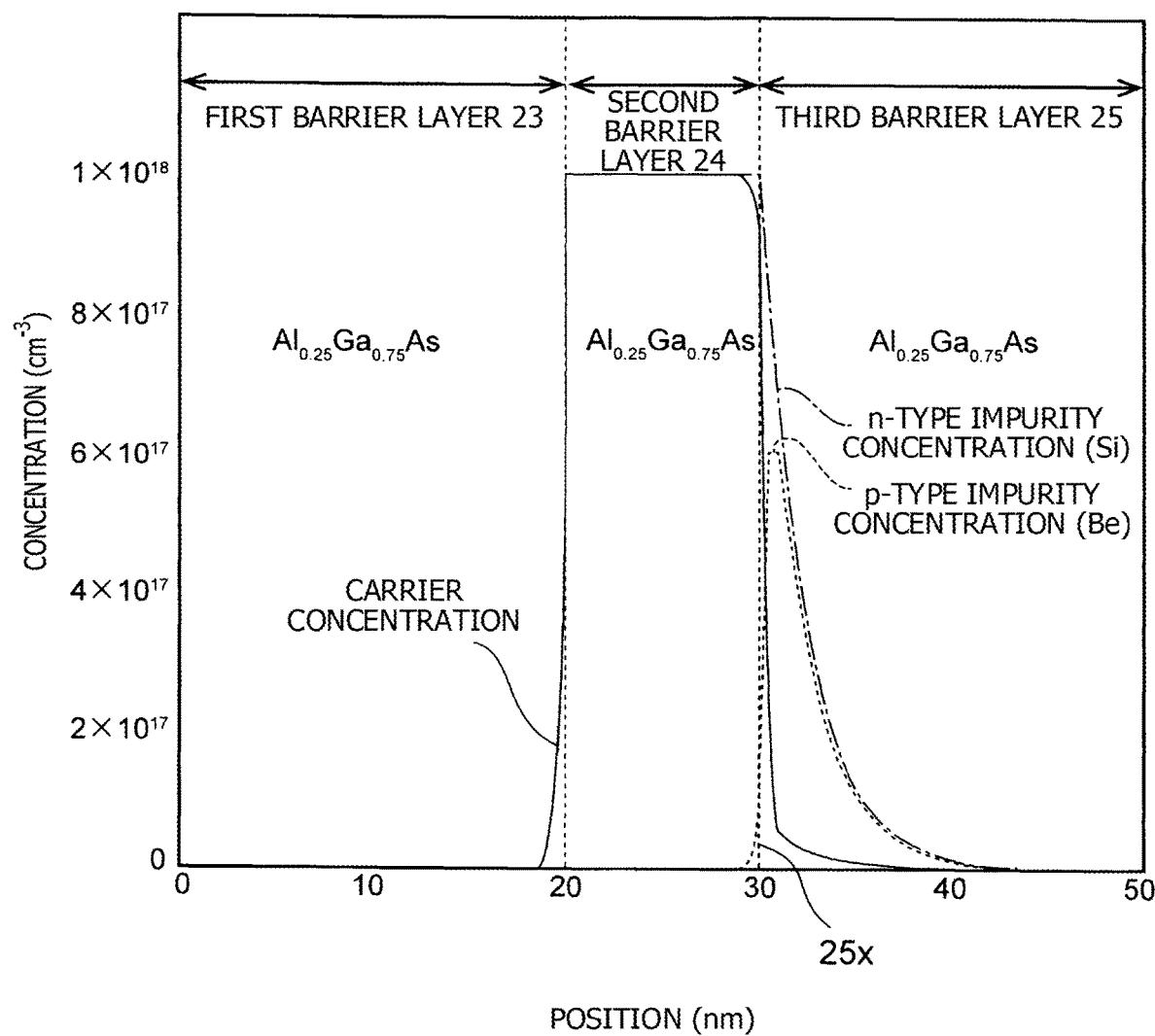
FIG. 18 is a graph illustrating the concentration profile of each of impurities and carriers when a third barrier layer is doped with beryllium (Be) in the first embodiment.

FIG. 18 is a graph illustrating the concentration profile of each of impurities and carriers when the third barrier layer 25 is doped with Be. The horizontal axis indicates the position in a height direction relative to the lower surface of the first barrier layer 23. Also, the vertical axis of FIG. 18 indicates the concentration of each of the p-type impurity (Be), the n-type impurity (Si), and the carriers (electrons) in the film.

As illustrated in FIG. 18, since the second barrier layer 24 is doped with Si, the third barrier layer 25 grows on the second barrier layer 24 while taking the Si thereof, and the profile of the n-type impurity spreads to the third barrier layer 25.

The Si diffusing to the third barrier layer 25 in this manner is compensated by Be with which the third barrier layer 25 is doped. Consequently, the carrier concentration in the third barrier layer 25 is reduced, and thus asymmetry of the carrier concentration in a vertical direction of the second barrier layer 24 may be reduced.

In particular, in this example, the peak concentration of Be is located at a position near the lower surface 25x of the third barrier layer 25, thus Si which has diffused at a high concentration near the lower surface 25x may be effectively compensated by Be, and the asymmetry of the carrier concentration is easily reduced.

As described above, the asymmetry of the carrier concentration causes the current $I_1$ (see FIG. 16) to be lower than the current $I_2$. However, the asymmetry of the carrier concentration is reduced in this manner, and the current $I_1$ is thereby increased nearly to the current $I_2$. Thus high sensitivity may be achieved by the increased current I which is the total of both currents $I_1$ and $I_2$.

In particular, in this example, as illustrated in FIG. 17, the p-type intermediate layer 25b is separated from the second barrier layer 24 by the i-type lower layer 25a which contains no impurities, and thus the Be contained in the p-type intermediate layer 25b is difficult to diffuse to the second barrier layer 24. As a consequence, it is possible to avoid undesirable reduction in the carrier concentration in the second barrier layer 24 and to effectively compensate the Si in the third barrier layer 25 by Be.

In addition, since the intervals $\Delta P_1$, $\Delta P_2$ are set to be equal as illustrated in FIG. 17, the second barrier layer 24 containing Si is equidistant from each of the upper and lower quantum well layers 27. Therefore, a difference is unlikely to occur between the potentials felt by carriers flowing in an upward direction of the substrate and carriers flowing in a downward direction of the substrate, thus the values of the currents $I_1$, $I_2$ are also unlikely to have a difference.

The inventor of the present application performed the following simulation to verify that the currents $I_1$, $I_2$ have nearly the same value in the embodiment.

Figure 19:
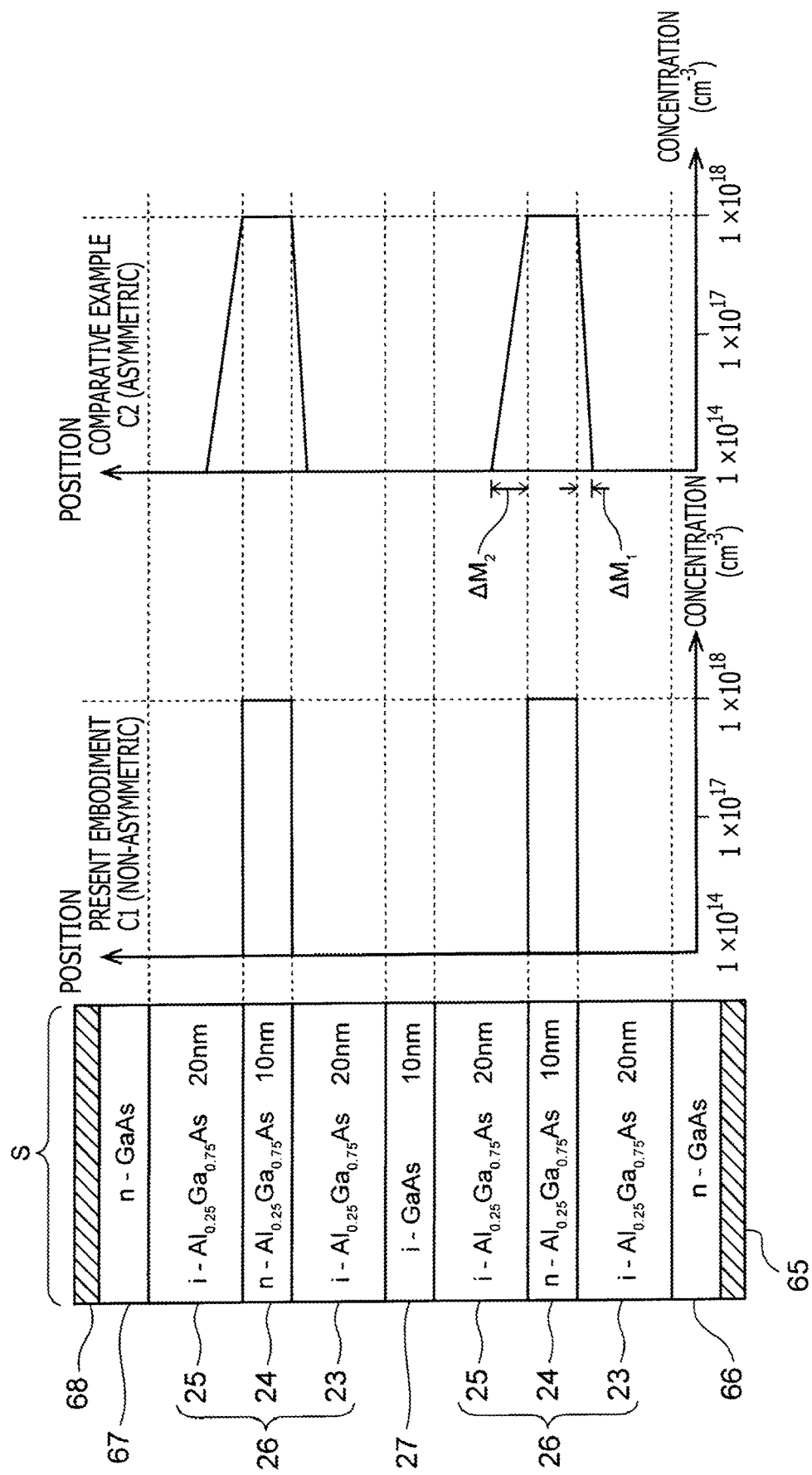
FIG. 19 is a cross-sectional view and a carrier profile of a model used in simulation in the first embodiment.

FIG. 19 is a cross-sectional view and a carrier profile of a model used in the simulation.

As illustrated in FIG. 19, in the model S, an n-type GaAs layer was formed on a collector electrode 65 as a lower contact layer 66, and the barrier layer 26 and the quantum well layer 27 were alternately stacked in multiple layers on the lower contact layer 66. The number of stacked layers is three for each of the barrier layer 26 and the quantum well layer 27.

Then, an n-type GaAs layer was formed as an upper contact layer 67 on the uppermost barrier layer 26, and an emitter electrode 68 was formed on the upper contact layer 67.

Also, two carrier profiles were prepared: non-asymmetric profile (embodiment C1) and asymmetric profile (comparative example C2).

Among these, the embodiment C1 provides a carrier profile in which the third barrier layer 25 is doped with Be as described above, and thus the carrier concentration is symmetric in a vertical direction of the second barrier layer 24.

In contrast, the comparative example C2 provides a carrier profile in which the third barrier layer 25 is not doped with Be, and thus the carrier concentration is asymmetric with respect to the second barrier layer 24 as the center. In order to represent the asymmetry, in the comparative example C2, $\Delta M_1$, the spread of carriers in a downward direction of the second barrier layer 24 was set to 0.5 nm, and $\Delta M_2$, the spread of carriers in an upward direction of the second barrier layer 24 was set to 3.8 nm which is larger than 0.5 nm.

Figure 20:
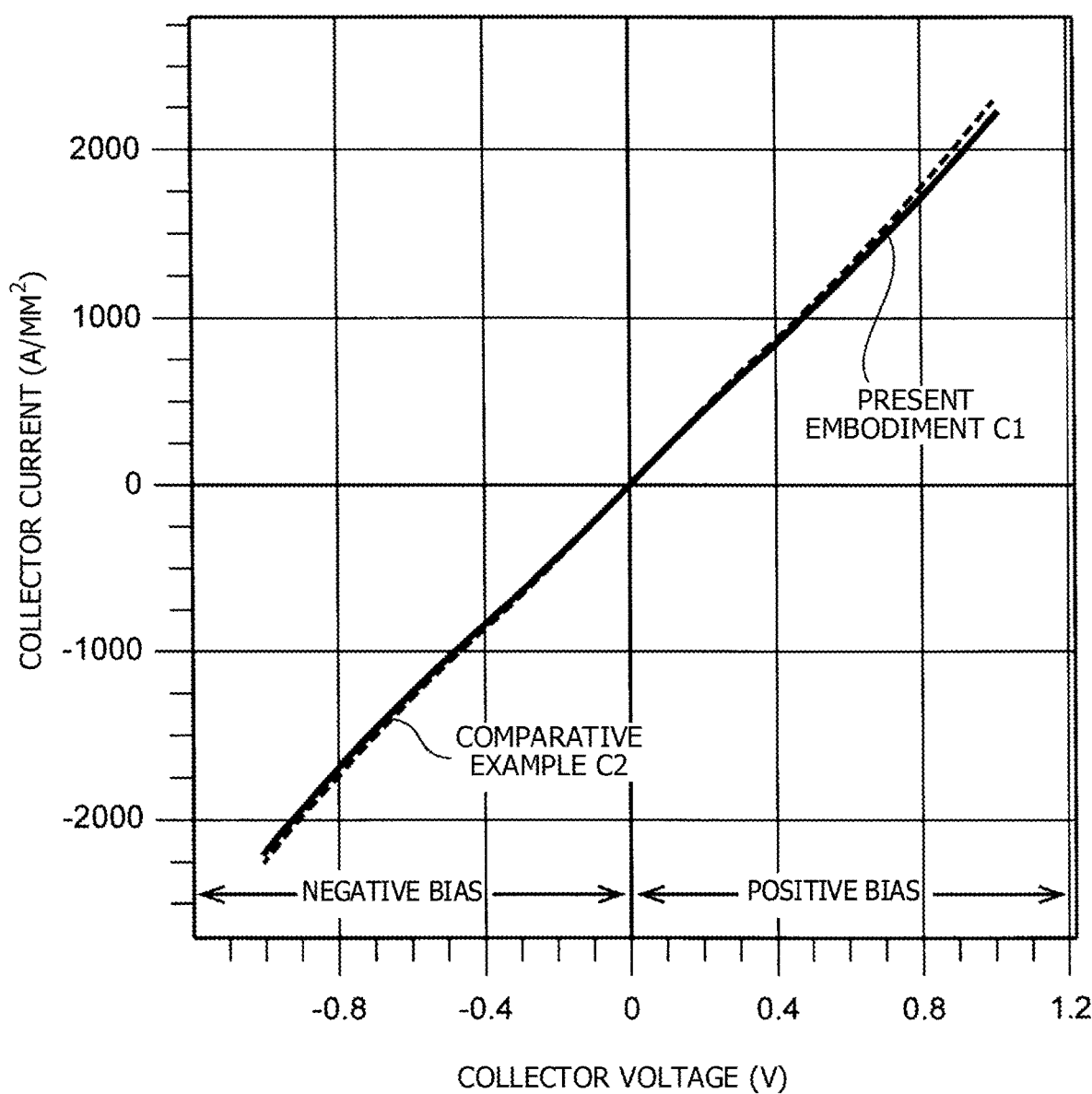
FIG. 20 is a graph obtained by simulating I-V characteristics of each of the first embodiment and a comparative example.

FIG. 20 is a graph obtained by simulating I-V characteristics of each of the embodiment C1 and the comparative example C2. The horizontal axis indicates collector voltage (V), and the vertical axis indicates collector current in amperes per millimeter squared (A/mm$^2$).

It is to be noted that the collector voltage is defined as the potential of the collector electrode 65 relative to the potential of the emitter electrode 68. Hereinafter, the collector voltage when positive is called a positive bias, and the collector voltage when negative is called a negative bias. Also, the collector current is the current that flows between the collector electrode 65 and the emitter electrode 68.

As illustrated in FIG. 20, the graphs of the embodiment C1 and the comparative example C2 do not completely match, and in each case of a positive bias and a negative bias, when the absolute value of the collector voltage increases, the difference between the graphs is significant.

Figure 21:
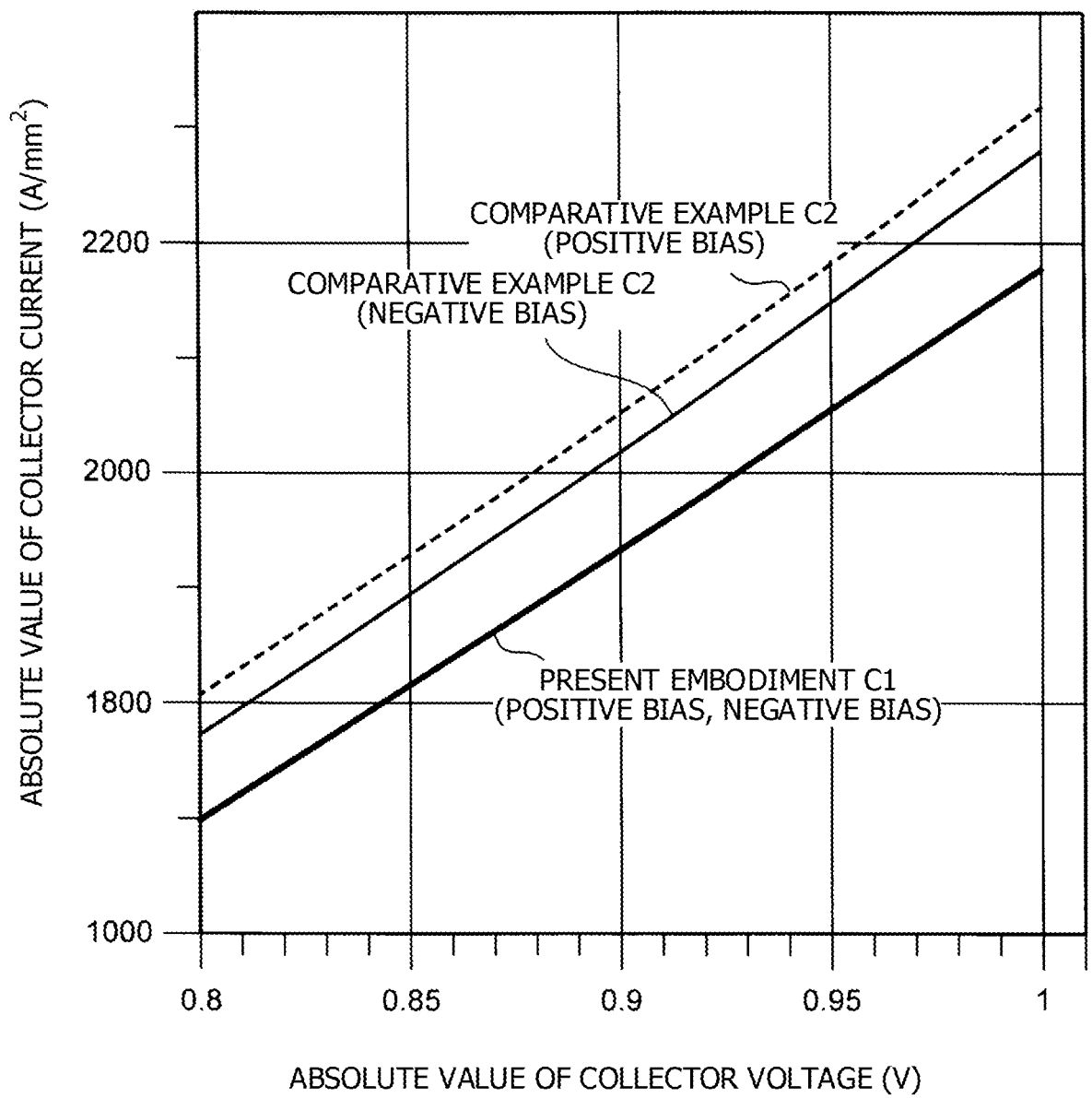
FIG. 21 is a graph obtained by simulating a relationship between the absolute value of a collector voltage and the absolute value of a collector current in each of the first embodiment and the comparative example.

FIG. 21 is a graph obtained by simulating a relationship between the absolute value of the collector voltage and the absolute value of the collector current in each of the embodiment C1 and the comparative example C2.

As illustrated in FIG. 21, in the comparative example C2, even with the same absolute value of collector voltage, the collector current had a difference of approximately 1.6% between a positive bias and a negative bias.

In contrast, in the embodiment, the collector current had almost no difference between a positive bias and a negative bias.

This verifies that compensation of Si taken into the third barrier layer 25 by Be as in the embodiment is effective to enhance the current $I_1$ nearly to the current $I_2$ and to reduce the difference between the both currents. Since the currents $I_1$, $I_2$ have nearly the same values in this manner, it is expected that the S/N ratio of the current I be improved by 1.2 times, as compared with when only one of the first light receiving layer 31 and the second light receiving layer 33 is formed, in which the sensitivity is saturated.

Although the embodiment has been described in detail so far, the embodiment is not limited to the above.

FIG. 22 is a table for explaining a variation in material and impurity of each layer of the imaging device 50 according to the embodiment.

As illustrated in FIG. 22, the imaging device 50 includes an InP/InGaAs based device in addition to the GaAs/AlGaAs based device mentioned above.

In the InP/InGaAs based device, each layer except the quantum well layer 27 is formed with InP, and the quantum well layer 27 is formed with $In_{0.53}Ga_{0.47}As$. Also, in this case, the intermediate layer 25b is doped with impurities which have an opposite conductivity-type to the impurities with which the second barrier layer 24 is doped. Thus, in the same manner as described above, it is possible to have nearly the same current $I_1$ and current $I_2$, and the sensitivity of the imaging device 50 may be increased.

Although a description has been given using an example in which each carrier is an electron, the carrier of the imaging device 50 may be a positive hole. In this case, it is sufficient that each of the lower contact layer 22, the second barrier layer 24, the intermediate contact layer 32, and the upper contact layer 34 be doped with one of Zn (zinc), Be, and C (carbon) as the p-type impurity, and the intermediate layer 25b be doped with Si as the n-type impurity. The same goes with an InP/InGaAs based imaging device 50.

Figure 23:
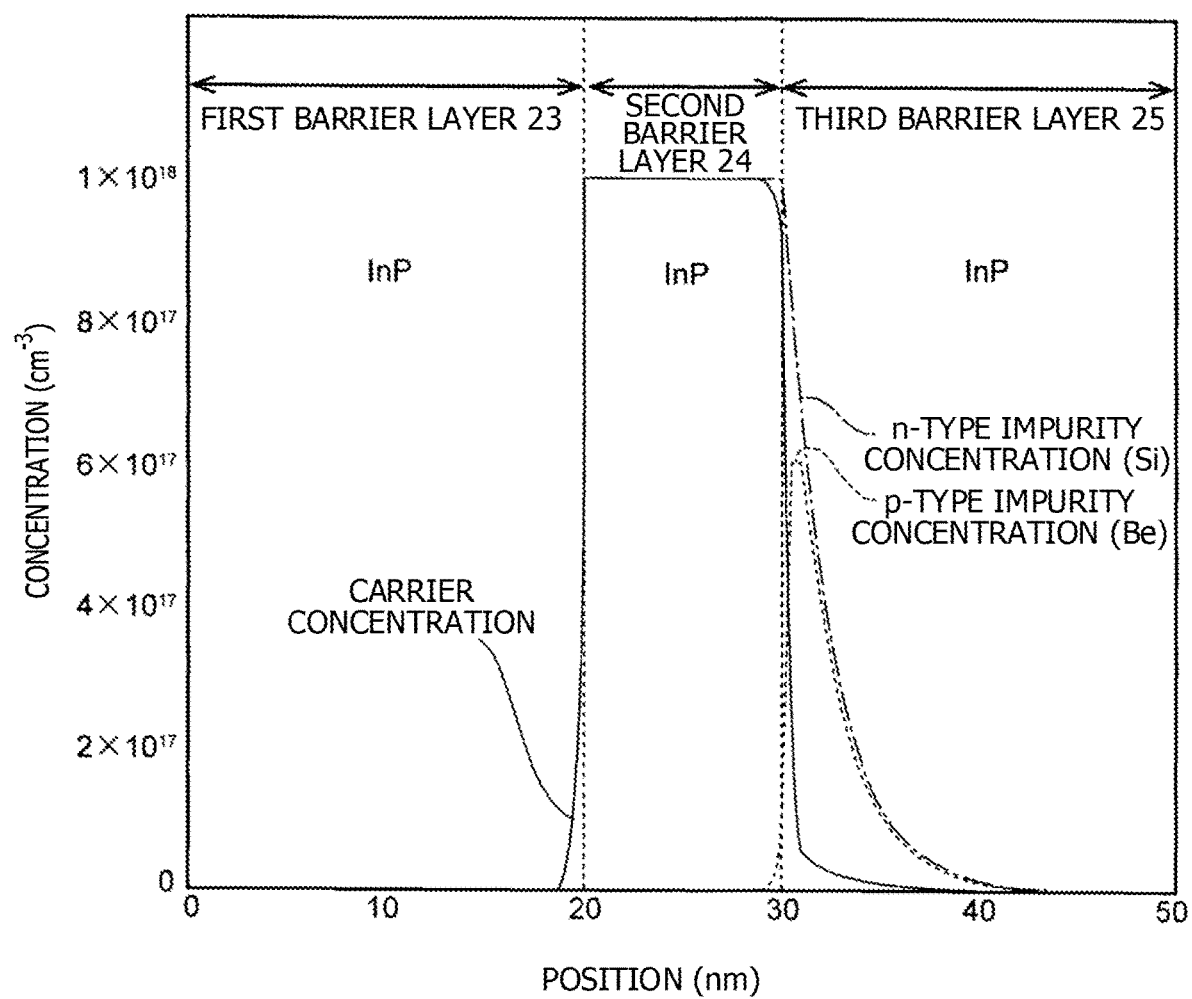
FIG. 23 is a graph illustrating the concentration profile of each of impurities and carriers of InP/InGaAs based imaging device according to the first embodiment.

FIG. 23 is a graph illustrating the concentration profile of each of impurities and carriers of the InP/InGaAs based imaging device 50. It is to be noted that it is assumed that an electron serves as a carrier in this example, and the horizontal axis and the vertical axis of FIG. 23 are the same as those in FIG. 18. Also, a p-type impurity C was used, with which the intermediate layer 25b of the third barrier layer 25 is doped.

Also in this case, in the same manner as in FIG. 18, the n-type impurity (Si) which has spread to the third barrier layer 25 is compensated by the p-type impurity (C) with which the third barrier layer 25 is doped, and the asymmetry of the carrier concentration in a vertical direction of the second barrier layer 24 may be reduced.

Second Embodiment

In the first embodiment, as described with reference to FIG. 17, the second barrier layer 24 was doped with Si for generating carriers (electrons).

In contrast, in this embodiment, the quantum well layer was doped with Si for generating carriers (electrons) in the following manner.

FIGS. 24A to 26 are each a cross-sectional view of the infrared image sensor, during a manufacturing process, according to this embodiment. It is to be noted that in FIGS. 24A to 26, the same component as described in the first embodiment is labeled with the same symbol, and a description thereof is omitted below.

Hereinafter, in the same manner as in the first embodiment, the GaAs/AlGaAs based QWIP will be described.

Figure 24A:
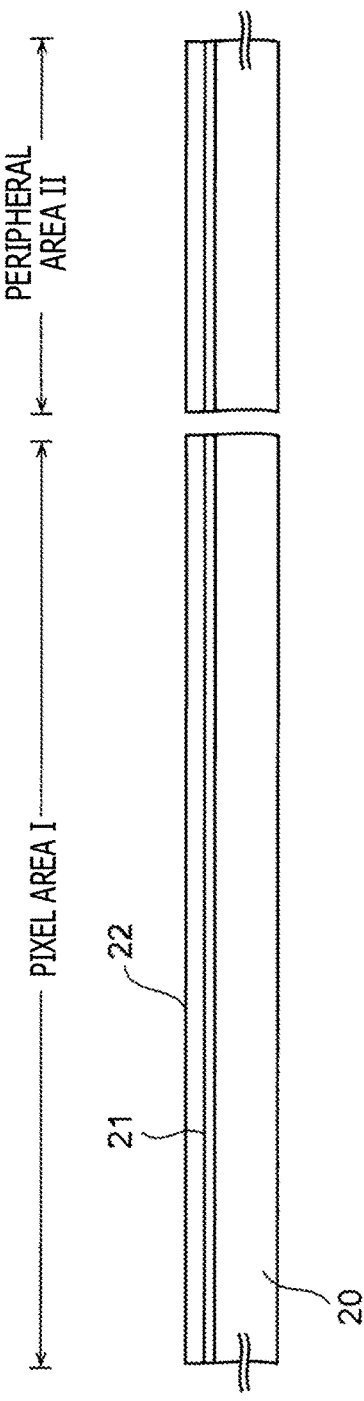
FIGS. 24A and 24B are each a cross-sectional view (part 1) of an infrared image sensor, during a manufacturing process, according to a second embodiment.

First, the step of FIG. 2A of the first embodiment is performed, and as illustrated in FIG. 24A, the buffer layer 21 and the lower contact layer 22 are formed in that order on the substrate 20 using the SS-MBE apparatus.

Figure 24B:
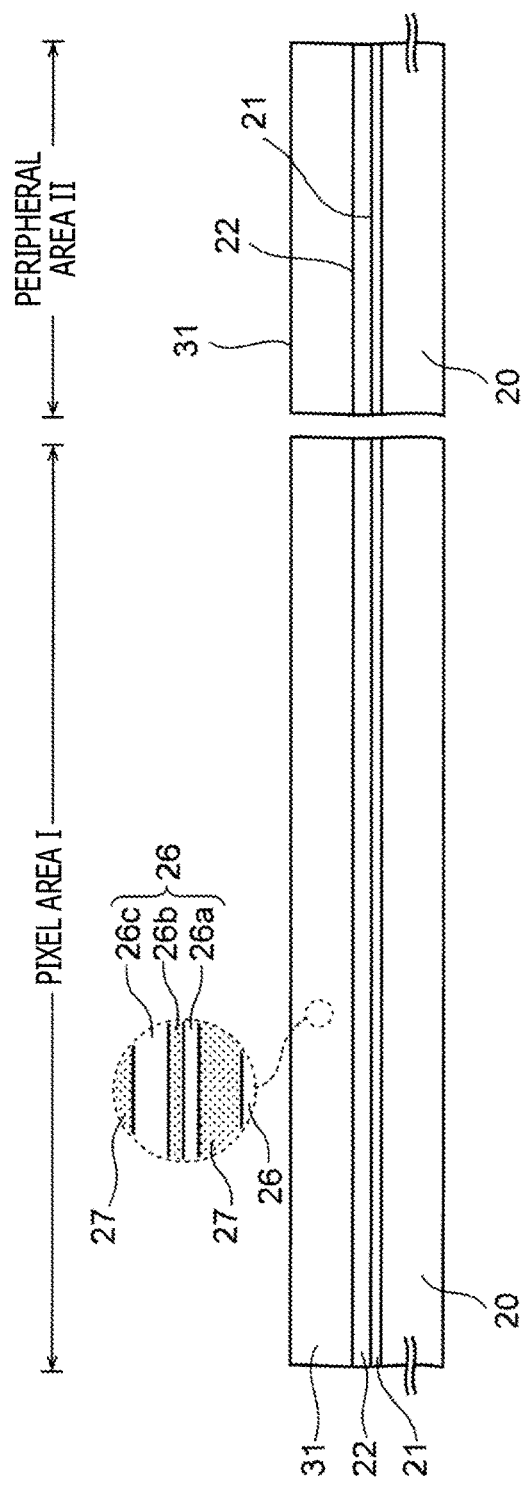

Subsequently, as illustrated in FIG. 24B, the barrier layer 26 and the quantum well layer 27 are each alternately stacked in 30 layers while the above-mentioned SS-MBE apparatus is being continuously used, and let the first light receiving layer 31 be these stacked-layer films.

The growth conditions for the barrier layer 26 and the quantum well layer 27 are not particularly limited. In this example, a beam of Si which is an n-type impurity is emitted to the surface of the barrier layer 26 while a beam of each of Ga and As is being emitted to the surface of the barrier layer 26, thereby forming an n-type GaAs layer with a thickness of approximately 10 nm as the quantum well layer 27. It is to be noted that in the embodiment, the quantum well layer 27 is an example of the first semiconductor layer.

The Si, with which the quantum well layer 27 was doped, is an example of the first conductivity-type impurity, and has a function of generating carriers (electrons). In this example, the quantum well layer 27 was doped with Si at a concentration of approximately $1.0 \times 10^{18}$ cm$^{-3}$.

In contrast, the barrier layer 26 is an example of the second semiconductor layer, and a lower layer 26a, an intermediate layer 26b, and an upper layer 26c are formed in that order. Among these, the lower layer 26a is an i-type $Al_{0.25}Ga_{0.75}As$ layer with a thickness of approximately 0.5 nm formed by emitting a beam of each of Al, Ga, and As to the surface of the quantum well layer 27.

Then a beam of Be which is a p-type impurity is emitted to the surface of the lower layer 26a while a beam of each of Al, Ga, and As is being emitted to the surface of the lower layer 26a, thereby forming a p-type $Al_{0.25}Ga_{0.75}As$ layer with a thickness of approximately 0.5 nm as the intermediate layer 26b.

In the embodiment, the Be, with which the intermediate layer 26b is doped, is an example of the second conductivity-type impurity.

In addition, a beam of each of Al, Ga, and As is emitted to the surface of the intermediate layer 26b, thereby forming an i-type $Al_{0.25}Ga_{0.75}As$ layer with a thickness of approximately 19 nm as the upper layer 26c.

Subsequently, as illustrated in FIG. 25A, a beam of each of Ga, As, and Si is emitted to the surface of the first light receiving layer 31, thereby forming an n-type GaAs layer with a thickness of approximately 1000 nm as the intermediate contact layer 32 while the above-mentioned SS-MBE apparatus is being continuously used. The concentration of Si in the intermediate contact layer 32 is, for instance, approximately $1.0 \times 10^{18}$ cm$^{-3}$.

Subsequently, as illustrated in FIG. 25B, a second light receiving layer 33 is formed on the intermediate contact layer 32 by performing the same steps as those by which the first light receiving layer 31 is formed. The layer structure of the second light receiving layer 33 is the same as that of the first light receiving layer 31, and the second light receiving layer 33 is formed by stacking each of the barrier layer 26 and the quantum well layer 27 in approximately 30 layers.

Figure 26:
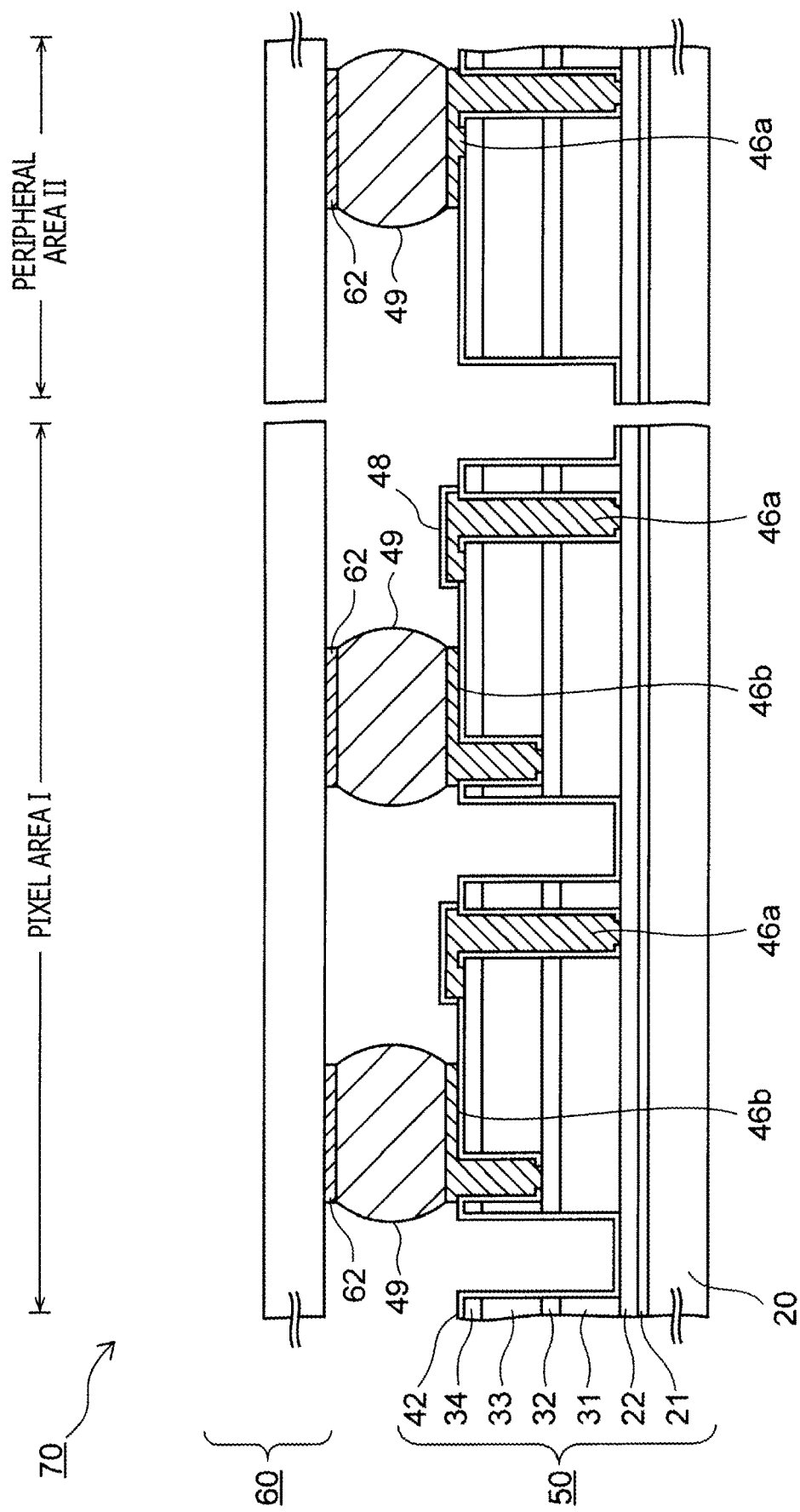
FIG. 26 is a cross-sectional view (part 3) of the infrared image sensor, during a manufacturing process, according to the second embodiment.

Subsequently, the basic structure of the infrared image sensor 70 according to the embodiment illustrated in FIG. 26 is completed by performing the same steps as those in FIGS. 5 to 13 described in the first embodiment.

Figure 27:
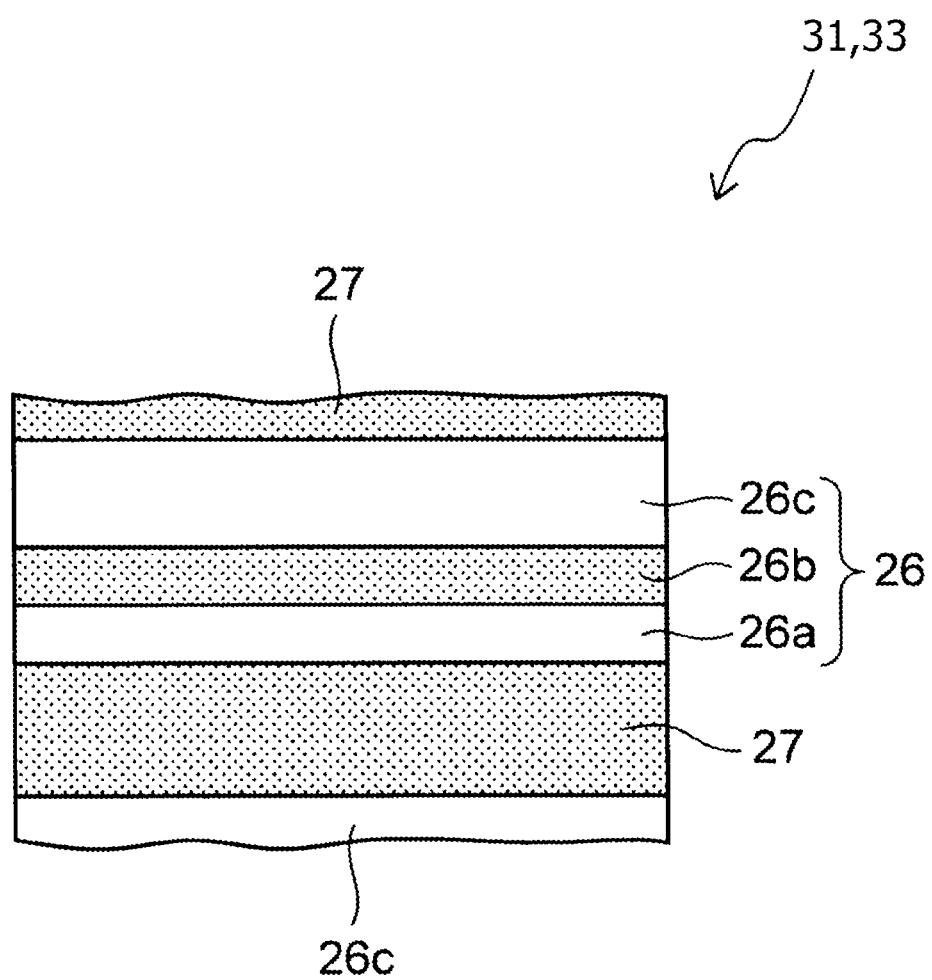
FIG. 27 is an enlarged cross-sectional view of a first light receiving layer and a second light receiving layer in the second embodiment.

FIG. 27 is an enlarged cross-sectional view of the first light receiving layer 31 and the second light receiving layer 33 in the embodiment.

As illustrated in FIG. 27, in the embodiment, the quantum well layer 27 is doped with Si as the n-type impurity, and carriers (electrons) are generated by the Si. Then, a p-type intermediate layer 26b is formed at a position near the quantum well layer 27 in the barrier layer 26, the p-type intermediate layer 26b being doped with Be which has an opposite conductivity-type to Si.

Figure 28:
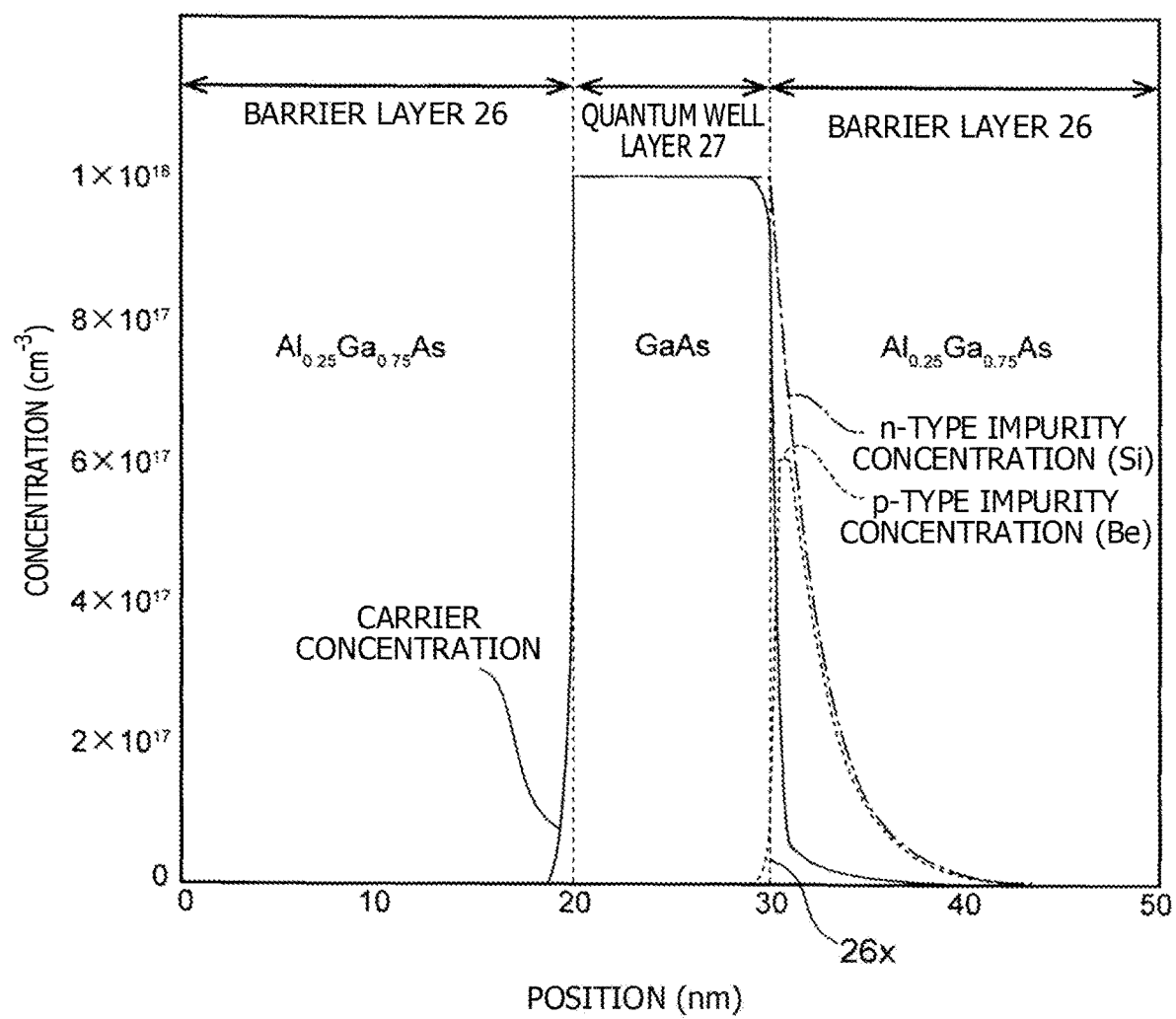
FIG. 28 is a graph illustrating the concentration profile of each of impurities and carriers when a barrier layer is doped with Be in the second embodiment.

FIG. 28 is a graph illustrating the concentration profile of each of impurities and carriers when the barrier layer 26 is doped with Be in this manner. The horizontal axis indicates the position in a height direction relative to the lower surface of the barrier layer 26. Also, the vertical axis of FIG. 28 indicates the concentration of each of the p-type impurity (Be), the n-type impurity (Si), and the carriers (electrons) in the film.

As illustrated in FIG. 28, since the quantum well layer 27 is doped with Si, the barrier layer 26 grows on the quantum well layer 27 while taking the Si thereof, and the profile of the n-type impurity spreads from the quantum well layer 27 to the barrier layer 26 on the quantum well layer 27.

The Si diffusing to the barrier layer 26 in this manner is compensated by Be with which the barrier layer 26 is doped, thus the carrier concentration in the barrier layer 26 is reduced, and asymmetry of the carrier concentration in a vertical direction of the quantum well layer 27 may be reduced.

Moreover, in this example, the peak concentration of Be is located at a position near the lower surface 26x of the barrier layer 26, thus the Si which has diffused at a high concentration near the lower surface 26x may be effectively compensated by Be.

Thus, in the same manner as in the first embodiment, it is possible to enhance the current $I_1$ (see FIG. 16) nearly to the current $I_2$, and to achieve high sensitivity of the infrared image sensor 70 by increasing the current I which is the total of both currents $I_1$ and $I_2$.

Moreover, in the embodiment, since the quantum well layer 27 is doped with the Si for generating carriers, it is possible to reliably generate carriers within the sub-bands in the quantum well layers 27.

Although the embodiment has been described in detail so far, the embodiment is not limited to the above.

FIG. 29 is a table for explaining a variation in material and impurity of each layer of the imaging device 50 according to the embodiment.

In the same manner as in the first embodiment, the imaging device 50 includes an InP/InGaAs based device in addition to the GaAs/AlGaAs based device mentioned above.

In the InP/InGaAs based device, each layer except the quantum well layer 27 is formed with InP, and the quantum well layer 27 is formed with $In_{0.53}Ga_{0.47}As$. Also, in this case, the intermediate layer 26b is doped with impurities which have an opposite conductivity-type to the impurities with which the quantum well layer 27 is doped. Thus, it is possible to have nearly the same current $I_1$ and current $I_2$, and the sensitivity of the imaging device 50 may be increased.

Although a description has been given using an example in which each carrier is an electron in the embodiment, the carrier of the imaging device 50 may be a positive hole. In this case, it is sufficient that each of the lower contact layer 22, the quantum well layer 27, the intermediate contact layer 32, and the upper contact layer 34 be doped with one of Zn, Be, and C as the p-type impurity, and the intermediate layer 26b be doped with Si as the n-type impurity. The same goes with an InP/InGaAs based imaging device 50.

Figure 30:
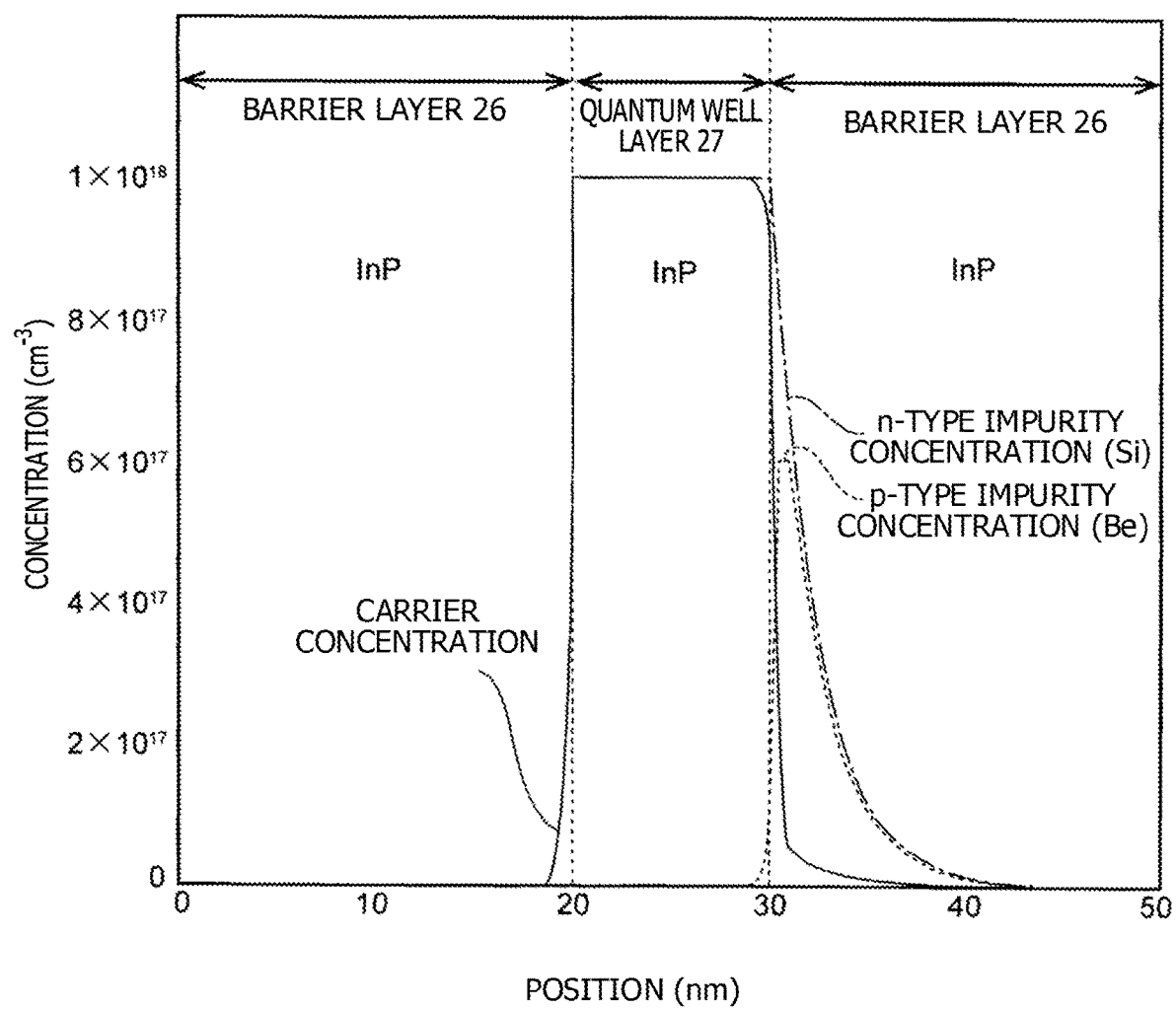
FIG. 30 is a graph illustrating the concentration profile of each of impurities and carriers of InP/InGaAs based imaging device according to the second embodiment.

FIG. 30 is a graph illustrating the concentration profile of each of impurities and carriers of an InP/InGaAs based imaging device 50 according to the embodiment. It is to be noted that it is assumed that an electron serves as a carrier in this example, and the horizontal axis and the vertical axis of FIG. 30 are the same as those in FIG. 28. Also, a p-type impurity C was used, with which the intermediate layer 26b of the barrier layer 26 was doped.

Also in this case, in the same manner as in FIG. 28, the n-type impurity (Si) which has spread upward of the quantum well layer 27 is compensated by the p-type impurity (C) with which the barrier layer 26 is doped, and the asymmetry of the carrier concentration in a vertical direction of the quantum well layer 27 may be reduced.

Third Embodiment

In this embodiment, an imaging system including the infrared image sensor described in the first and second embodiments will be described.

Figure 31:
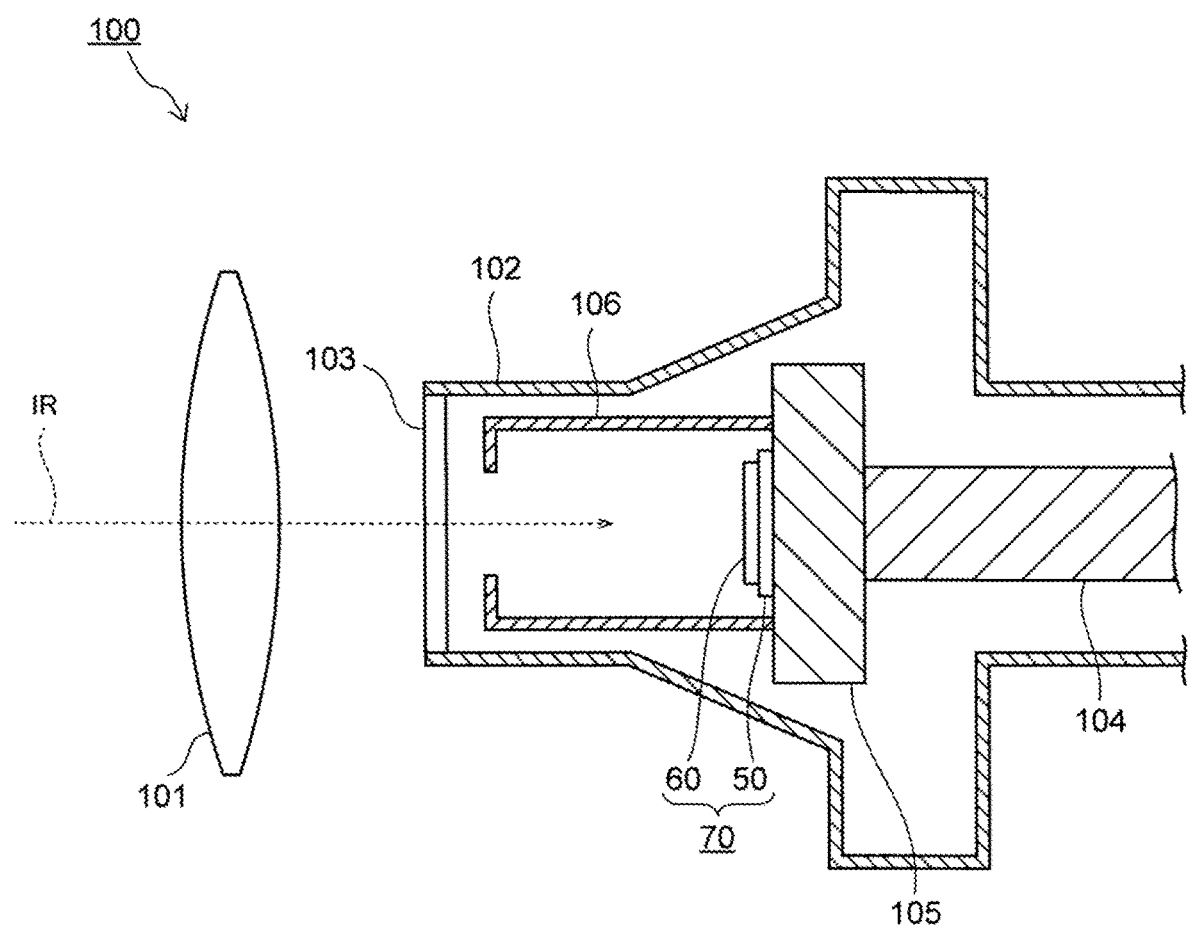
FIG. 31 is a configuration diagram of an imaging system according to a third embodiment.

FIG. 31 is a configuration diagram of an imaging system according to this embodiment.

It is to be noted that in FIG. 31, the same component as described in the first and second embodiments is labeled with the same symbol in those embodiments, and a description thereof is omitted below.

As illustrated in FIG. 31, an imaging system 100 includes an imaging lens 101, and the image sensor 70 that is provided at a subsequent stage of the imaging lens 101.

Among these, the imaging lens 101 is a lens for obtaining an infrared image to be captured, and the image sensor 70 is provided in the focal plane.

The image sensor 70 is stored in a container 102, and receives infrared light IR through an infrared transmission window 103 which is provided in an opening of the container 102.

A cold finger 104 and a cooling head 105 are provided in the container 102. The cold finger 104 is connected to a cooling device like a Peltier device (not illustrated), thus cools the image sensor 70 via the cooling head 105 to reduce noise which occurs in the image sensor 70.

It is to be noted that a cold shield 106 is provided upright on the cooling head 105 around the image sensor 70, and the cold shield 106 is able to prohibit stray light from entering the image sensor 70 against.

With the imaging system 100, as described in the first and second embodiments, since the sensitivity of the imaging device 50 included in the image sensor 70 is enhanced, even when the infrared light emitted from a subject is weak, it is possible to capture a clear infrared image by the imaging system 100.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An infrared detector comprising:
a substrate;
a lower contact layer formed on the substrate;
a first light receiving layer that is formed on the lower contact layer and has a quantum well structure, the first receiving light layer including:
a first semiconductor layer doped with a first conductivity-type impurity, and
a second semiconductor layer formed on the first semiconductor layer, and being doped with a second conductivity-type impurity which compensates the first conductivity-type impurity;
an intermediate contact layer formed on the first light receiving layer;
a second light receiving layer that is formed on the intermediate contact layer and has the quantum well structure, the second light receiving layer including:
the first semiconductor layer doped with the first conductivity-type impurity, and
the second semiconductor layer formed on the first semiconductor layer, and being doped with the second conductivity-type impurity which compensates the first conductivity-type impurity; and
an upper contact layer formed on the second light receiving layer.

2. The infrared detector according to claim 1,
wherein each of the first light receiving layer and the second light receiving layer includes a quantum well layer and a barrier layer that form the quantum well structure, and
each of the first semiconductor layer and the second semiconductor layer are layers in part of the barrier layer.

3. The infrared detector according to claim 2,
wherein a first interval between a lower surface of the barrier layer and a lower surface of the first semiconductor layer is equal to a second interval between an upper surface of the barrier layer and an upper surface of the first semiconductor layer.

4. The infrared detector according to claim 1,
wherein each of the first light receiving layer and the second light receiving layer includes a quantum well layer and a barrier layer that form the quantum well structure, and
the first semiconductor layer is the quantum well layer, and the second semiconductor layer is the barrier layer.

5. The infrared detector according to claim 1,
wherein a peak concentration of the second conductivity-type impurity is located at a position near a lower surface of the second semiconductor layer.

6. The infrared detector according to claim 1,
wherein the first conductivity-type impurity is diffused in the second semiconductor layer.

7. An imaging device comprising:
a plurality of pixels spaced at intervals in a plane including:
a substrate;
a lower contact layer formed on the substrate;
a first light receiving layer that is formed on the lower contact layer and has a quantum well structure;
an intermediate contact layer formed on the first light receiving layer;
a second light receiving layer that is formed on the intermediate contact layer and has a quantum well structure; and
an upper contact layer formed on the second light receiving layer,
wherein each of the first light receiving layer and the second light receiving layer includes:
a first semiconductor layer that is doped with a first conductivity-type impurity, and a second semiconductor layer that is formed on the first semiconductor layer, and is doped with a second conductivity-type impurity which compensates the first conductivity-type impurity.

8. The imaging device according to claim 7, wherein
each of the first light receiving layer and the second light receiving layer includes a quantum well layer and a barrier layer that form the quantum well structure, and
each of the first semiconductor layer and the second semiconductor layer are layers in part of the barrier layer.

9. The imaging device according to claim 8, wherein
a first interval between a lower surface of the barrier layer and a lower surface of the first semiconductor layer is equal to a second interval between an upper surface of the barrier layer and an upper surface of the first semiconductor layer.

10. The imaging device according to claim 7, wherein
each of the first light receiving layer and the second light receiving layer includes a quantum well layer and a barrier layer that form the quantum well structure, and
the first semiconductor layer is the quantum well layer, and the second semiconductor layer is the barrier layer.

11. The imaging device according to claim 7, wherein
a peak concentration of the second conductivity-type impurity is located at a position near a lower surface of the second semiconductor layer.

12. The imaging device according to claim 7, wherein
the first conductivity-type impurity is diffused in the second semiconductor layer.

13. An imaging system comprising:
an imaging lens; and
an imaging device that is provided at a subsequent stage of the imaging lens and includes a plurality of pixels spaced at intervals in a plane,
wherein each of the plurality of pixels includes:
a substrate;
a lower contact layer formed on the substrate;
a first light receiving layer that is formed on the lower contact layer and has a quantum well structure;
an intermediate contact layer formed on the first light receiving layer;
a second light receiving layer that is formed on the intermediate contact layer and has a quantum well structure; and an upper contact layer formed on the second light receiving layer, wherein each of the first light receiving layer and the second light receiving layer includes:

a first semiconductor layer that is doped with a first conductivity-type impurity, and a second semiconductor layer that is formed on the first semiconductor layer, and is doped with a second conductivity-type impurity which compensates the first conductivity-type impurity.

14. The imaging system according to claim 13, wherein each of the first light receiving layer and the second light receiving layer includes a quantum well layer and a barrier layer that form the quantum well structure, and each of the first semiconductor layer and the second semiconductor layer are layers in part of the barrier layer.

15. The imaging system according to claim 14, wherein a first interval between a lower surface of the barrier layer and a lower surface of the first semiconductor layer is equal to a second interval between an upper surface of the barrier layer and an upper surface of the first semiconductor layer.

16. The imaging system according to claim 13, wherein each of the first light receiving layer and the second light receiving layer includes a quantum well layer and a barrier layer that form the quantum well structure, and the first semiconductor layer is the quantum well layer, and the second semiconductor layer is the barrier layer.

17. The imaging system according to claim 13, wherein a peak concentration of the second conductivity-type impurity is located at a position near a lower surface of the second semiconductor layer.

18. A method of manufacturing an infrared detector comprising:

providing a substrate:

forming a first contact layer on the substrate;

forming a first light receiving layer on the first contact layer;

forming an intermediate layer on the first light receiving layer;

forming a second light receiving layer on the intermediate layer; and forming an upper contact layer on the second light receiving layer, the first light receiving layer includes:

a first semiconductor layer doped with a first conductivity-type impurity, a second semiconductor layer on the first semiconductor layer and doped with a second conductivity-type impurity which compensates for the first conductivity-type impurity, and a first quantum well layer, the second light receiving layer including:

a third semiconductor layer doped with the first conductivity-type impurity, a fourth semiconductor layer on the third semiconductor layer and doped with the second conductivity-type impurity which compensates for the first conductivity-type impurity, and a second quantum well layer.

* * * * *